(12) United States Patent
Yamada et al.

(10) Patent No.: US 11,367,824 B2
(45) Date of Patent: Jun. 21, 2022

(54) THERMOELECTRIC CONVERSION MATERIAL, THERMOELECTRIC CONVERSION DEVICE HAVING THE SAME, THERMO-ELECTROCHEMICAL CELL AND THERMOELECTRIC SENSOR

(71) Applicant: JAPAN SCIENCE AND TECHNOLOGY AGENCY, Kawaguchi (JP)

(72) Inventors: Teppei Yamada, Fukuoka (JP); Hongyao Zhou, Matsue (JP); Nobuo Kimizuka, Fukuoka (JP)

(73) Assignee: JAPAN SCIENCE AND TECHNOLOGY AGENCY, Kawaguchi (JP)

( * ) Notice: Subject to any disclaimer, the term of this patent is extended or adjusted under 35 U.S.C. 154(b) by 113 days.

(21) Appl. No.: 16/082,476

(22) PCT Filed: Mar. 9, 2017

(86) PCT No.: PCT/JP2017/009511
§ 371 (c)(1),
(2) Date: Sep. 5, 2018

(87) PCT Pub. No.: WO2017/155046
PCT Pub. Date: Sep. 14, 2017

(65) Prior Publication Data
US 2019/0081224 A1      Mar. 14, 2019

(30) Foreign Application Priority Data

Mar. 9, 2016   (JP) .............................. JP2016-046309

(51) Int. Cl.
*H01L 35/28* (2006.01)
*H01L 35/24* (2006.01)
(Continued)

(52) U.S. Cl.
CPC ............... *H01L 35/28* (2013.01); *G01J 5/12* (2013.01); *G01K 7/02* (2013.01); *H01L 35/04* (2013.01);
(Continued)

(58) Field of Classification Search
CPC ............... H01L 35/28; G01J 5/12; G01K 7/02
See application file for complete search history.

(56) References Cited

U.S. PATENT DOCUMENTS

| 5,310,608 A | 5/1994 | Ishizawa et al. |
| 2006/0225782 A1* | 10/2006 | Berke ..................... B82Y 10/00 136/252 |
| 2011/0048525 A1* | 3/2011 | Yoneya ................ H01G 9/2022 136/256 |

FOREIGN PATENT DOCUMENTS

| CN | 101218707 A | 7/2008 |
| CN | 102265453 A | 11/2011 |

(Continued)

OTHER PUBLICATIONS

Fujiwara et al., JP 2006216252 A, English Machine Translation, pp. 1-8. (Year: 2006).*
International Search Report dated May 9, 2017, in PCT/JP2017/009511 filed Mar. 9, 2017.
Abraham, T.J. et al., "High Seebeck coefficient redox ionic liquid electrolytes for thermal energy harvesting", Energy & Environmental Science, (GB). 2013, vol. 6, No. 9, pp. 2639-2645 (19 total pages).

(Continued)

*Primary Examiner* — Tae-Sik Kang
(74) *Attorney, Agent, or Firm* — Oblon, McClelland, Maier & Neustadt, L.L.P.

(57) ABSTRACT

The present invention provides a thermoelectric conversion material having a considerably increased Seebeck coefficient, and a thermoelectric conversion device, a thermo-electrochemical cell and a thermoelectric sensor which include the material. The thermoelectric conversion material of the present invention includes a redox pair and a capture compound which captures only one of the redox pair selectively at low temperature and releases at high temperature.

15 Claims, 18 Drawing Sheets

(51) Int. Cl.
G01K 7/02 (2021.01)
H01M 14/00 (2006.01)
G01J 5/12 (2006.01)
H01L 35/04 (2006.01)
H01L 35/14 (2006.01)
H01L 35/34 (2006.01)
H01M 6/36 (2006.01)

(52) U.S. Cl.
CPC .............. *H01L 35/14* (2013.01); *H01L 35/24* (2013.01); *H01L 35/34* (2013.01); *H01M 14/00* (2013.01); *H01M 6/36* (2013.01); *H01M 2220/30* (2013.01)

(56) References Cited

FOREIGN PATENT DOCUMENTS

| | | | |
|---|---|---|---|
| JP | 2003-229605 | | 8/2003 |
| JP | 2004-235011 | A | 8/2004 |
| JP | 2005-071895 | A | 3/2005 |
| JP | 2006-216252 | A | 8/2006 |
| JP | 2006216252 | A * | 8/2006 |
| WO | WO 2006/123785 | A1 | 11/2006 |
| WO | WO 2015/164907 | A1 | 11/2015 |

OTHER PUBLICATIONS

Abraham, T.J. et al., "Seebeck coefficients in ionic liquids—prospects for thermo-electrochemical cells", Chemical Communications, (GB), 2011, vol. 47, pp. 6260-6262 (5 total pages).

Alzahrani, Hassan A.H. et al., "Combining thermogalvanic corrosion and thermogalvanic redox couples for improved electrochemical waste heat harvesting", Electrochemistry Communications, 2015, vol. 58, pp. 76-79.

Extended European Search Report dated Oct. 23, 2019, in Patent Application No. 17763386.4, 6 pages.

Koerver, R. et al., "Evaluation of Electrochemical Methods for Determination of the Seebeck Coefficient of Redox Electrolytes", Electrochimica Acta, Elsevier, XP029325616, vol. 184, Oct. 17, 2015, pp. 186-192.

Zhou, H. et al., "Supramolecular Thermo-Electrochemical Cells: Enhanced Thermoelectric Performance by Host-Guest Complexation and Salt-Induced Crystallization", Journal of the American Chemical Society, XP002794931, vol. 138, Aug. 10, 2016, pp. 10502-10507.

Chinese Office Action dated Jun. 3, 2021, in Chinese Patent Application No. 201780015254.2 (with English Translation for Search Report).

* cited by examiner

Tri-O-Me-α-CD:Hexakis-(2,3,6-tri-O-methyl)-α-Cyclodextrin
Di-O-Me-α-CD:Hexakis-(2,6-di-O-methyl)-α-Cyclodextrin

THERMOELECTRIC CONVERSION MATERIAL, THERMOELECTRIC CONVERSION DEVICE HAVING THE SAME, THERMO-ELECTROCHEMICAL CELL AND THERMOELECTRIC SENSOR

TECHNICAL FIELD

The present invention relates to a thermoelectric conversion material, a thermoelectric conversion device having the thermoelectric conversion material, a thermo-electrochemical cell, and a thermoelectric sensor.

Priority is claimed on Japanese Patent Application No. 2016-046309, filed Mar. 9, 2016, the content of which is incorporated herein by reference.

BACKGROUND ART

In order to convert minute energy such as waste heat into electric power, a thermoelectric conversion material has attracted attention in recent years. Among them, it is expected that thin and efficient thermoelectric conversion materials are used as energy sources for mobile devices and the like. However, a conventional alloy-based thermoelectric conversion material has a disadvantage of high thermal conductivity and low Seebeck coefficient (Se). Therefore, thereto-electrochemical cells, which are one type of thermoelectric conversion materials using a solution of ions capable of oxidation and reduction, have attracted attention in recent years (Non-Patent Document 1).

While the Seebeck coefficient (Se) of a conventional solid thermoelectric alloy is about 0.2 mV/K, the thermo-electrochemical cells can be manufactured at low cost while Seebeck coefficient (Se) is one order of magnitude larger. For example, in a thermo-electrochemical cell composed of $I^-$ and $I_3^-$, a potential is generated by deviating an equilibrium potential at a high temperature and a low temperature wherein the equilibrium potential is formed by the redox equilibrium. Seebeck coefficient is about 600 µV/K, which is known to be higher than that of the alloy based thermoelectric conversion material. However, there was a problem that conductivity of the electrolyte was low. Further improvement of the Seebeck coefficient is required (Non-Patent Document 2).

[Non-Patent Document 1] Theodore J. Abraham et al., "High Seebeck coefficient redox ionic liquid electrolytes for thermal energy harvesting", Energy & Environmental Science, (UK), 2013, vol. 6, p. 2639-2645.

[Non-Patent Document 2] Theodore J. Abraham et al., "Seebeck coefficients in ionic liquids-prospects for thermo-electrochemical cells", Chemical Communications, (UK), 2011, vol. 47, p. 6260-6262.

SUMMARY OF THE INVENTION

In order to solve the above problems, the present invention provides a new method of improving Seebeck coefficient, and focuses on a compound which can captures only one of the redox pair selectively at a low temperature and can release it at a high temperature. As a specific example when the redox pair is an iodide ion ($I^-$) and a triiodide ion ($I_3^-$), according to host-guest chemistry, for example, $I_3^-$ is captured by cyclodextrin at a low temperature and $I_3^-$ is released at a high temperature by adding cyclodextrin to an electrolytic solution containing the redox pair. As a result, an equilibrium potential of redox shifts greatly, and Seebeck coefficient and thermoelectric conversion efficiency are improved.

We have found that it is possible to improve Seebeck coefficient over conventional thermoelectric conversion materials by adding a capture compound which captures only one of the redox pair selectively at low temperature and releases it at high temperature to the electrolyte. In the case of a specific example of a thermo-electrochemical cell comprising an iodide ion and a triiodide ion, it is possible to improve Seebeck coefficient (Se) up to 2 mV/K by adding cyclodextrin which captures a triiodide ion at a low temperature and releasing it at a high temperature, in order to improve the performance of the device.

The present invention is as follows [1] to [11].

[1] A thermoelectric conversion material including: a redox pair and a capture compound which captures only one of the redox pair selectively at low temperature and releases it at high temperature.

[2] The thermoelectric conversion material according to [1], wherein the capture compound is at least one selected from the group consisting of a cyclic compound and a spiral compound.

[3] The thermoelectric conversion material according to [1] or [2], wherein the capture compound is a self-assembly molecule at a low temperature.

[4] The thermoelectric conversion material according to [1] or [2], wherein the capture compound is a host compound forming an inclusion compound.

[5] The thermoelectric conversion material according to [1] or [2], wherein the capture compound is one or more selected from the group consisting of cyclodextrin, starch, polyvinyl pyrrolidone, and polyethylene oxide.

[6] The thermoelectric conversion material according to any one of [1] to [5], wherein the redox pair is a pair selected from the group consisting of iodide ion and triiodide ion, ferrocyanide ion and ferricyanide ion, and tris(bipyridine) cobalt (II) and tris(bipyridine) cobalt (III).

[7] The thermoelectric conversion material according to any one of [1] to [6], wherein the thermoelectric conversion material further comprises an electrolyte for self-assembling the capture compound at a low temperature.

[8] A thermoelectric conversion device comprising: the thermoelectric conversion material according to any one of [1] to [7] and a pair of electrodes.

[9] The thermoelectric conversion device according to [8], wherein the pair of electrodes are set to different temperatures.

[10] A thermo-electrochemical cell comprising: the thermoelectric conversion device according to [8] or [9].

[11] A thermoelectric sensor comprising: the thermoelectric conversion device according to [8] or [9].

According to the present invention, it is possible to improve Seebeck coefficient over the conventional thermoelectric conversion material by adding a capture compound to the electrolyte wherein the capture compound is capable of capturing only one of a redox pair selectively at a low temperature and releases it at a high temperature. In particular, by adding cyclodextrin to a thermo-electrochemical cell comprising an iodide ion and a triiodide ion, it is possible to improve Seebeck coefficient up to about 2000 µV/K.

DETAILED DESCRIPTION OF THE INVENTION

<Thermoelectric Conversion Material>

Figure 1:
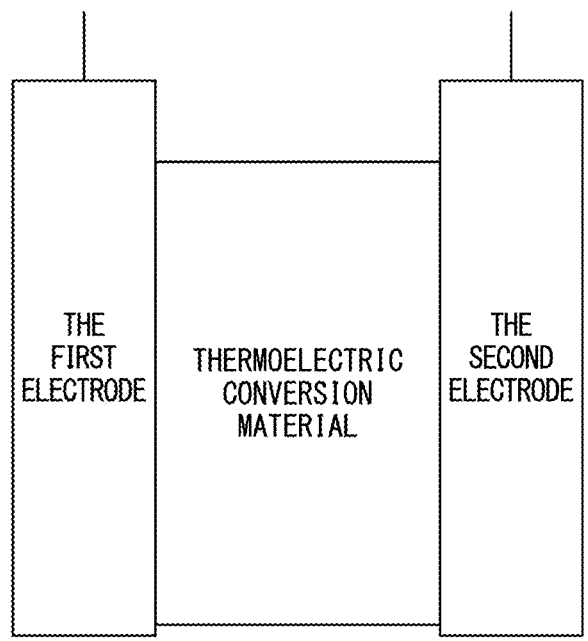
FIG. 1 is a conceptual diagram showing a thermoelectric conversion device including a thermoelectric conversion material of the present invention.

The thermoelectric conversion material of the present invention includes a redox pair and a capture compound that captures only one of the redox pair selectively at a low temperature and releases it at a high temperature. In this specification, the term "thermoelectric conversion material" refers to a material that directly converts heat to electricity or directly converts electricity to heat, such as a material which can be used in a device using Seebeck effect, a device using Peltier effect, a device using Thomson effect, or the like. FIG. 1 is a conceptual diagram showing a thermoelectric conversion device including a thermoelectric conversion material of the present invention.

The capture compound is not particularly limited as long as it is a capture compound which captures only one of the redox pair selectively at a low temperature and releases it at a high temperature. Examples of the capture compound may be a polymer such as a cyclic compound or a spiral compound which is capable of capturing a target into the capture compound. In addition, for example, if an aggregate formed by self-assembly of a capture compound is capable of capturing only one of the redox pair at low temperature selectively and release it at high temperature, the capture compound may be a self-assembly compound at low temperature. An example of the cyclic compound is cyclodextrin. An example of the helical compound is starch. It is preferable that the capture compound is one or more selected from the group consisting of cyclodextrin, starch, polyvinyl pyrrolidone, polyethylene oxide, polyethylene glycol and the like, more preferably cyclodextrin.

The redox pair is composed of an active species of oxidizing agent and an active species of reducing agent. The active species of oxidizing agent may be reduced to the active species of reducing agent by reduction reaction; or the active species of reducing agent may be oxidized to the active species of oxidizing agent by oxidation reaction. The redox pair is preferably a pair of an iodide ion and a triiodide ion.

The thermoelectric conversion material of the present invention contains an ionic electrolyte, and the ionic electrolyte is preferably an ionic liquid, more preferably an aqueous solvent containing water and an organic solvent or water. For example, when the ionic electrolyte is an aqueous solvent or water, the redox pair undergoes redox reaction in an aqueous solvent or water and the capture compound selectively capturing only one of the redox pair in an aqueous solvent or water at low temperature, and releasing it at high temperature.

The ionic electrolyte may contain ions other than the redox pair. For example, when the ionic electrolyte is an aqueous solvent or water, it preferably contains alkali ions.

It is further preferable to include an electrolyte that makes the capture compound to self-assemble at low temperature.

When the redox pair is an iodide ion and a triiodide ion, the capture compound is preferably cyclodextrin capable of capturing triiodide ion, and more preferably α-cyclodextrin. It is preferable that the ionic electrolyte is an aqueous solvent or water. It is preferable that the aqueous solvent or water further contains an alkali ion.

<Thermoelectric Conversion Device>

A thermoelectric conversion device of the present invention has the thermoelectric conversion material and the pair of electrodes described above. The "thermoelectric conversion device" is a device including all of a thermoelectric conversion device capable of interconverting thermal energy and electric energy, such as a Seebeck device using a thermoelectric conversion material, a Peltier device or the like; and a known device using a thermoelectric conversion material.

The thermoelectric conversion device of the present invention includes, for example, a redox pair, a capture compound that captures only one of the redox pair selectively at a low temperature and releases it at a high temperature, an ionic electrolyte, a first electrode and a second electrode. In addition, the electrolyte is in physical contact with the at least a part of surface of the first electrode and at least a part of surface of the second electrode.

<<Capture Compound>>

The capture compound is not particularly limited as long as it is a capture compound which captures only one of the redox pair selectively at a low temperature and releases it at a high temperature. Examples of the capture compound may be a polymer such as a cyclic compound or a spiral compound which is capable of capturing a target into the capture compound. It is preferable that the capture compound is a host compound that forms an inclusion compound by inclusion of a capturing target. In addition, for example, if an aggregate formed by self-assembly of the capture compound is capable of capturing only one of the redox pair at low temperature selectively and release it at high temperature, the capture compound may be a self-assembly compound at low temperature. An example of the cyclic compound is cyclodextrin. Examples of the spiral compound include starch, polyvinyl pyrrolidone, and polyethylene oxide. Further, examples of the host compound include cyclodextrin, starch, polyvinyl pyrrolidone, and polyethylene oxide. It is preferable that the capture compound is one or more selected from the group consisting of cyclodextrin, starch, polyvinyl pyrrolidone, polyethylene oxide, polyethylene glycol and the like, and it is more preferably that the capture compound is cyclodextrin.

The cyclodextrin may be one or more compounds selected from the group consisting of α-cyclodextrin (α-CD), β-cyclodextrin (β-CD), γ-cyclodextrin (γ-CD), hexakis-(2,6-di-O-methyl)-α-cyclodextrin (Di-O-Me-α-CD) and hexakis-(2,3,6-tri-O-methyl)-α-cyclodextrin (Tri-O-Me-α-CD). Preferably, the cyclodextrin may be one or more compounds selected from the group consisting of α-cyclodextrin (α-CD), hexakis-(2,6-di-O-methyl)-α-cyclodextrin (Di-O-Me-α-CD), and hexakis-(2,3,6-tri-O-methyl)-α-cyclodextrin (Tri-O-Me-α-CD).

<<Redox Pair>>

The redox pair includes an active species of oxidizing agent and an active species of reducing agent. The active species of oxidizing agent can be reduced to the active species of reducing agent by reduction reaction or the active species of reducing agent can be oxidized to the active species of oxidizing agent by oxidation reaction. The redox pair is preferably a pair selected from the group consisting of a pair of iodide ion and triiodide ion, a pair of ferrocyanide ion and ferricyanide ion, a pair of tris(bipyridine) cobalt (II) and tris(bipyridine) cobalt (III), and a pair of ferrocene monocarboxylic acid (Fe(II)) and ferrocenium monocarboxylic acid (Fe(III)). It is preferably that the redox pair is a pair of an iodide ion and a triiodide ion.

<<Ionic Electrolyte>>

The ionic electrolyte is preferably an ionic liquid or an ionic solid, more preferably an aqueous solvent containing water and an organic solvent or water. For example, when the ionic electrolyte is an aqueous solvent or water, an oxidation-reduction reaction occurs in a redox pair in an aqueous solvent or water, and the capture compound selectively captures only one of the redox pair in an aqueous solvent or water at low temperature and releasing it at high temperature. It is preferable that the aqueous electrolyte further contains an alkali ion such as potassium ion.

<<First Electrode or Second Electrode>>

As a material of the partial surface portion of the first electrode or the second electrode in contact with the electrolyte, a conductive material such as platinum or carbon may be used. Since platinum has a high dissolution potential and excellent corrosion resistance, platinum is preferable. From the viewpoint of low manufacturing cost and large surface area, carbon such as graphite is preferable.

<<Thermoelectric Conversion Device of First Embodiment>>

In a thermoelectric conversion device according to the first embodiment of the present invention, for example, in the first electrode, an oxidation reaction in which one reducing agent of the redox pair is changed to the other oxidizing agent occurs; and in the second electrode, a reduction reaction in which the oxidizing agent is changed to the reducing agent occurs. An example of the thermoelectric conversion device is a power generating device such as Seebeck device in which there is a temperature difference between the first electrode and the second electrode, and a potential difference arises due to the temperature difference, and as a result, a thermoelectromotive force between the first electrode and the second electrode is generated.

<<Thermoelectric Conversion Device of Second Embodiment>>

In the thermoelectric conversion device of the second embodiment of the present invention, for example, in the first electrode, an oxidation reaction in which one reducing agent of the redox pair is changed to the other oxidizing agent occurs; and in the second electrode, a reduction reaction in which the oxidizing agent is changed to the reducing agent occurs. An example of the thermoelectric conversion device is a cooling or heating device such as a Peltier device in which there is a potential difference between the first electrode and the second electrode, and a temperature difference arises due to the potential difference, and as a result, heat transfer between the first electrode and the second electrode is generated.

<<Thermoelectric Conversion Device of Third Embodiment>>

In the thermoelectric conversion device of the third embodiment of the present invention, for example, an oxidation reaction of a redox pair occurs in the first electrode at the low temperature side and a reduction reaction of the redox pair occurs in the second electrode at the high temperature side. An Example of the thermoelectric conversion device is an n-Type Seebeck device in which a capture compound captures the oxidizing species of the redox pair and a thermoelectromotive force between the first electrode and the second electrode is generated.

<<Thermoelectric Conversion Device of Fourth Embodiment>>

In the thermoelectric conversion device of the fourth embodiment of the present invention includes, for example, iodide ion and triiodide ion, cyclodextrin, water or an aqueous solvent, as well as a first electrode at a low temperature side and a second electrode at a high temperature side. The aqueous electrolyte physically contacts at least a part of the surface of the first electrode and a part of the surface of the second electrode. In addition, at least the material of the electrode surface which is partly in contact with the electrolytic solution is an electrically conductive material such as platinum, carbon, or the like. Among them, since platinum having a high dissolution potential and excellent corrosion resistance, platinum is particularly preferable. From the viewpoint of low manufacturing cost and large surface area, carbon such as graphite is preferable.

The aqueous electrolyte preferably further contains an alkali ion such as potassium ion.

<Thermo-Electrochemical Cell>

The thermo-electrochemical cell of the present invention includes a Seebeck device in which a temperature difference between the first electrode and the second electrode is generated by using the thermoelectric conversion material of the present invention, and the oxidation-reduction reaction occurs at the first electrode and the second electrodes based on the temperature difference, and as a result, a potential difference between the first electrode and the second electrode is generated.

A Seebeck device is evaluated by the Seebeck coefficient (Se) shown by the following numerical formula 1.

$$S_e = \frac{\Delta E(T_H - T_L)}{\Delta T} \quad (1)$$

$T_H$: High Temperature $T_L$: Low Temperature (Where $\Delta E$ is the potential difference between the electrodes and $\Delta T$ is the temperature difference.)

The thermoelectric conversion material of the thermo-electrochemical cell of the present invention includes a redox pair and a capture compound that captures only one of the redox pair selectively at a low temperature and releases it at high temperature. From the relationship among the concentration of the active species of oxidizing agent ([Ox]) and the concentration of the active species of reducing agent ([Red]) of the redox pair, the electrode temperature (T) and the standard potential (Ef), at the first electrode or the second electrode, the oxidation-reduction potential (E) of the redox pair can be expressed by the following formula (2) of Nernst equation.

$$E = E_f + \frac{RT}{nF}\ln\frac{[Ox]}{[Red]} \quad (2)$$

As shown in the formula (2), the oxidation-reduction potential (E) of the redox pair is dependent on the standard potential (Ef), the temperature, the concentration of active species of oxidizing agent ([Ox]) and the concentration of active species of the reducing agent ([Red]) of the redox pair.

According to the present invention, when the capture compound that captures only one of the redox pair selectively at a low temperature and that releases it at a high temperature is included, for example, in the vicinity of the first electrode at the low temperature side, an active species of oxidizing agent generated by oxidation in the oxidation reaction are captured, and as a result, the concentration of the active species of oxidizing agent ([Ox]) are decreased. In the vicinity of the second electrode at the high temperature, the active species of oxidizing agent which is the reaction product of the reduction reaction is released, and the concentration of active species of oxidizing agent ([Ox]) is increased. As a result, a concentration difference of active species of oxidizing agent ([Ox]) is generated in the vicinity of the first electrode and in the vicinity of the second electrode. As compared with a conventional temperature difference cell which does not contains the capture compound, a potential difference between the first and second electrodes is generated.

<<Thermo-Electrochemical Cell of First Embodiment>>

[Addition of Cyclodextrin]

The thereto-electrochemical cell of the first embodiment of the present invention includes iodide ion, triiodide ion, α-cyclodextrin, water or an aqueous solvent, as well as the first electrode at the low temperature side and the second electrode at the high temperature side.

[Inclusion of $I_3^-$ by α-Cyclodextrin]

Inclusion of $I_3^-$ by α-cyclodextrin represented by chemical formula (1) selectively includes hydrophobic $I_3^-$ rather than hydrophilic $I^-$ as disclosed in the prior art.

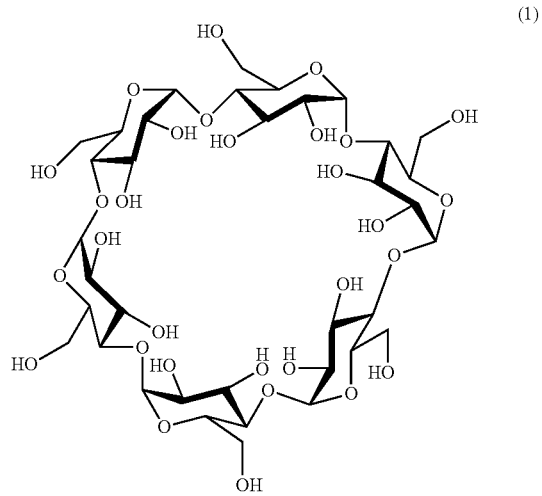 [SMILES: OCC1O[C@@H]2O[C@@H]3C(CO)O[C@H](O[C@@H]4C(CO)O[C@H](O[C@@H]5C(CO)O[C@H](O[C@@H]6C(CO)O[C@H](O[C@@H]7C(CO)O[C@H](O[C@H]1[C@H](O)C2O)C(O)[C@H]7O)C(O)[C@H]6O)C(O)[C@H]5O)C(O)[C@H]4O)C(O)[C@H]3O]

(1)

Figure 2:
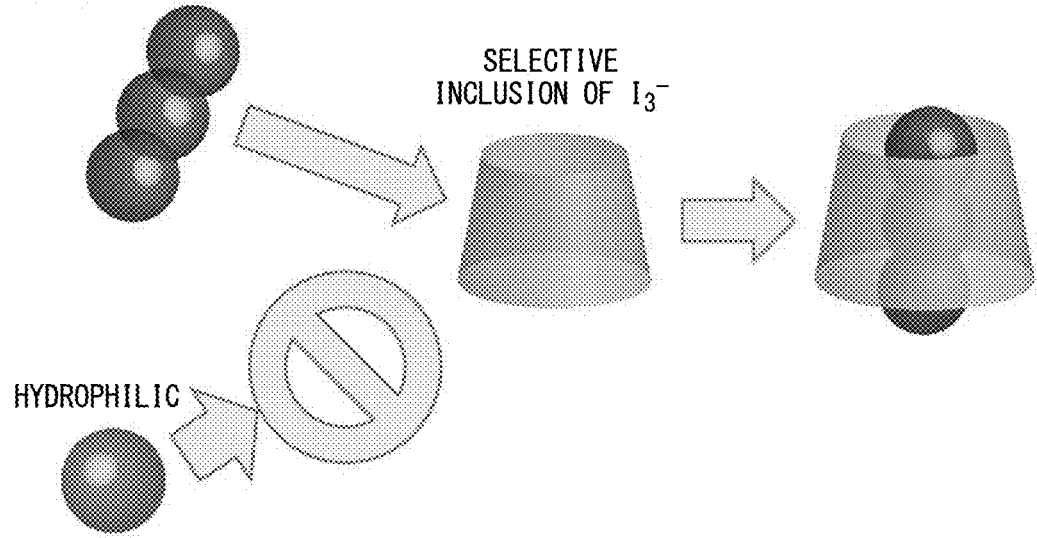
FIG. 2 is a conceptual diagram showing selective inclusion of $I_3^-$ by α-cyclodextrin.

FIG. 2 is a conceptual diagram showing selective inclusion of $I_3^-$ by α-cyclodextrin in the vicinity of the electrode at the low temperature side.

In the vicinity of the first electrode at the low temperature side, the active species of oxidizing agent $I_3^-$ generated in the oxidation reaction ($I^-/I_3^-$) is captured and the concentration of oxidizing species ([$I_3^-$]) is decreased. In the vicinity of second electrode at the high temperature, the active species of oxidizing agent which is a reaction product of the reduction reaction ($I_3^-/I^-$) is released to increase the concentration of active species of oxidizing agent ([$I_3^-$]). As a result, a concentration difference of active species of oxidizing agent ($[I_3^-]$) is generated in the vicinity of the first electrode and in the vicinity of the second electrode, and as compared with the conventional temperature difference cell not containing the capture compound, thereby increasing the potential difference between the first electrode and the second electrode (formula 3).

$$\frac{[I_3^-]}{[I^-]^3}(T_L) < \frac{[I_3^-]}{[I^-]^3}(T_H) \quad (3)$$

$T_H$: High Temperature $T_L$: Low Temperature

Figure 3:
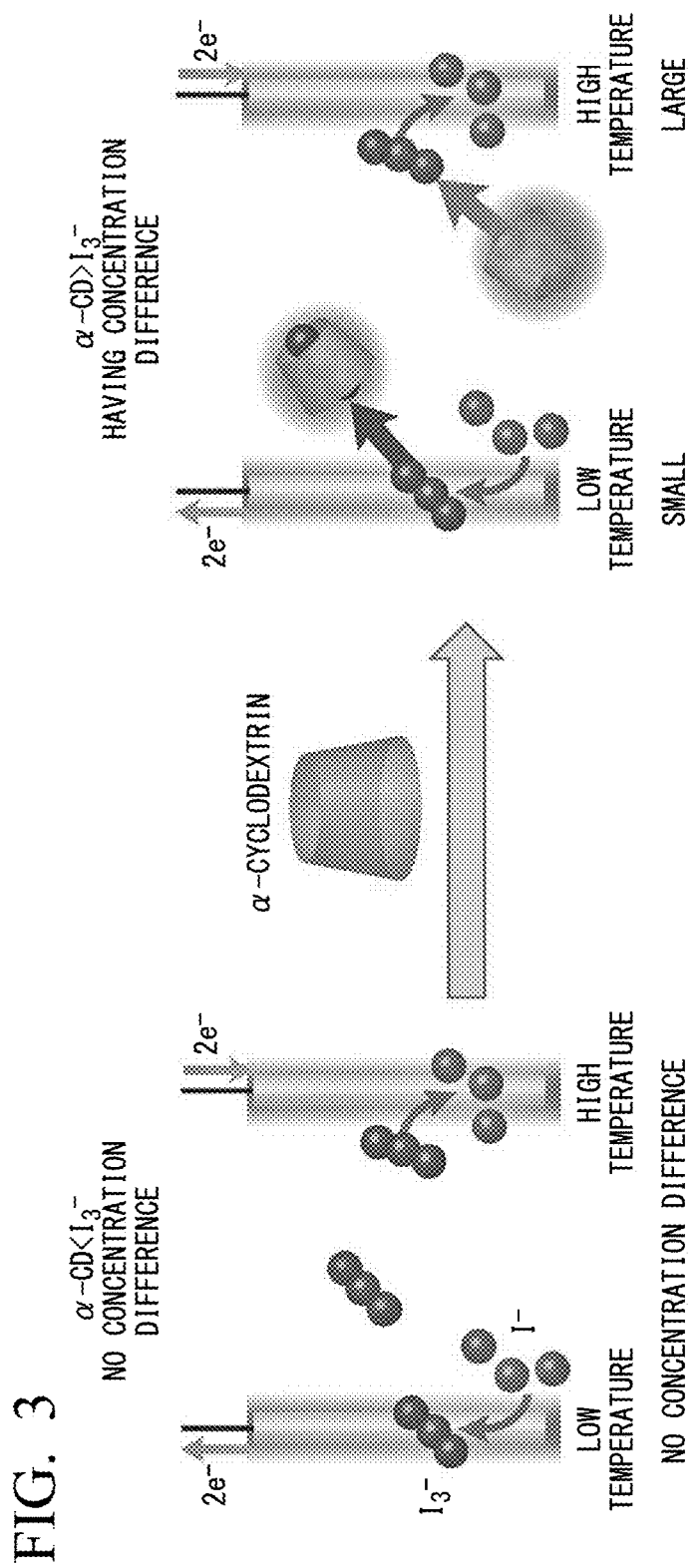
FIG. 3 is a conceptual diagram showing that $I_3^-$ is selectively enclosed in the vicinity of the first electrode at low temperature side by adding α-cyclodextrin (α-CD).

According to the formula (4) of Nernst equation, since the potential depends on the concentration, the potential difference increases (as shown in FIG. 3) when there is a concentration difference.

$$E = E_f + \frac{RT}{2F} \ln \frac{[I_3^-]}{[I^-]^3} \quad (4)$$

FIG. 3 is a conceptual diagram showing selective inclusion of $I_3^-$ near the first electrode at low-temperature side by adding α-cyclodextrin (α-CD).

As a result, by the addition of α-cyclodextrin, it is possible to obtain a Seebeck coefficient of about 2 mV/K which is three times higher than that without the addition of α-cyclodextrin.

[Relative Concentration and Seebeck Coefficient of Capture Compound]

Figure 4:
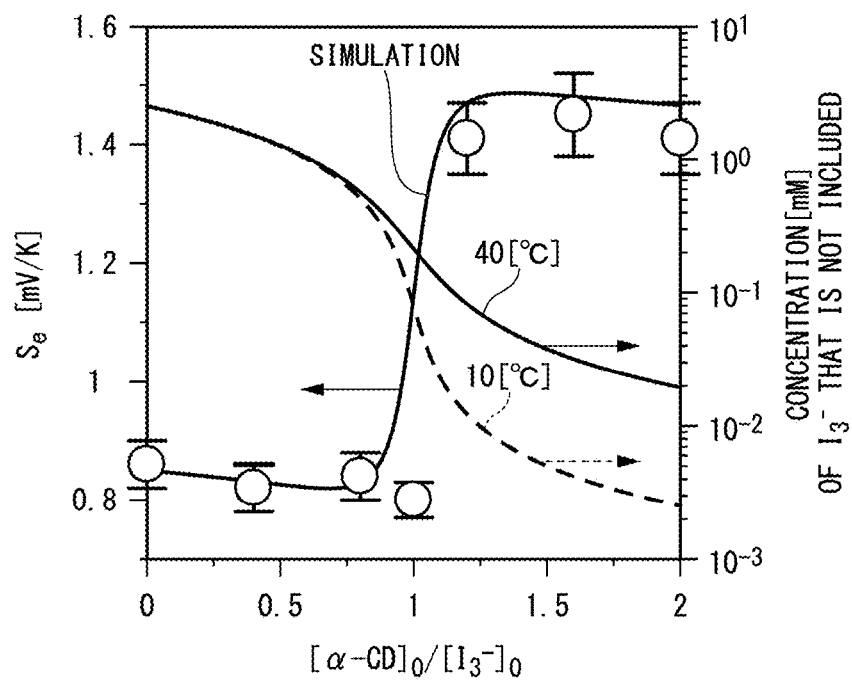
FIG. 4 shows a relationship between a Seebeck coefficient (Se), and a ratio ($[\alpha\text{-CD}]_0/[I_3^-]_0$) of added concentration of α-cyclodextrin ($[\alpha\text{-CD}]_0$) and added concentration of $I_3^-$ ($[I_3^-]_0$).

FIG. 4 shows a relationship between Seebeck coefficient (Se), and a ratio ($[α-CD]_0/[I_3^-]_0$) of addition concentration of α-cyclodextrin ($[α-CD]_0$) and addition concentration of $I_3^-$ ($[I_3^-]_0$); and the relationship between a concentration of free $I_3^-$ and $[α-CD]_0/[I_3^-]_0$. As shown in FIG. 4, after $[α-CD]_0/[I_3^-]_0 > 1$, the concentration difference of free $I_3^-$ between at the first electrode at 10° C. (broken line) and at the second electrode at 40° C. (solid line) increases.

Binding constants of α-CD and $I_3^-$ obtained from isothermal titration calorimetry are shown in the following Table 1. When the temperature raises 30° C., the binding constant of α-CD and $I_3^-$ decreases by 12%.

TABLE 1

| Binding Constants of α-CD and $I_3^-$ (Isothermal Titration Calorimetry) | |
|---|---|
| 10° C. | 40° C. |
| 3.7 × 10$^5$ | 4.4 × 10$^4$ |

The solid line in FIG. 4 is the Seebeck coefficient (Se) obtained by simulation using the formula (4) of Nernst equation. It was shown that the Seebeck coefficient increases with the concentration difference of $I_3^-$.

$$E = E_f + \frac{RT}{2F} \ln \frac{[I_3^-]}{[I^-]^3} \quad (4)$$

<<Thermo-Electrochemical Cell of Second Embodiment>>

[Effect of Supporting Electrolyte to Seebeck Coefficient]

The thermo-electrochemical cell of the second embodiment of the present invention is the same as that of the thermo-electrochemical cell of the first embodiment, except for further addition of alkali ions such as potassium ions. By adding alkali ions, a higher Seebeck coefficient can be obtained.

Figure 5:
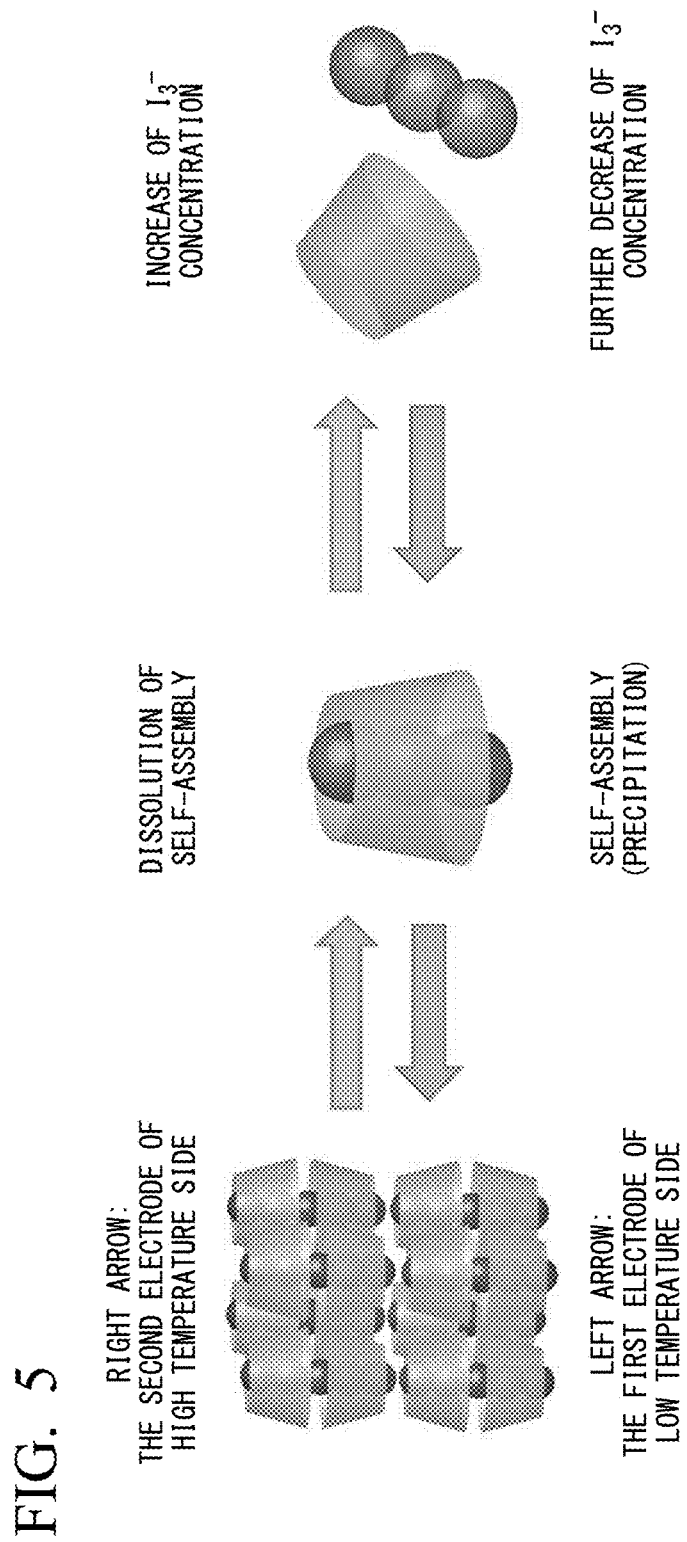
FIG. 5 is a conceptual diagram showing that an inclusion compound of α-cyclodextrin and $I_3^-$ further self-assembles with potassium ions in a system containing potassium ions.

For example, by adding potassium ion ($K^+$), a dark green precipitate $K[(α-CD)_2-I_5]$ is generated in the vicinity of the first electrode, further reducing the concentration of $I_3^-$. The amount of precipitation in the vicinity of the first electrode at the low temperature side is greater than the amount of precipitation near the second electrode at high temperature side. The concentration difference of $I_3^-$ increases by generating precipitation. As a result, the Seebeck coefficient increases to the maximum 1.96 mV/K. The reasons of obtaining the Seebeck coefficient are listed as follows. (FIG. 5)

[i] Self-assembly (precipitate formation) occurs at low temperature.

[ii] The complex concentration in the solution decreases.

[iii] $I_3^-$ concentration at low temperature is further reduced.

FIG. 5 is a conceptual diagram showing that inclusion compounds of α-cyclodextrin and $I_3^-$ further self-assemble with potassium ions when potassium ions are added.

Figure 6:
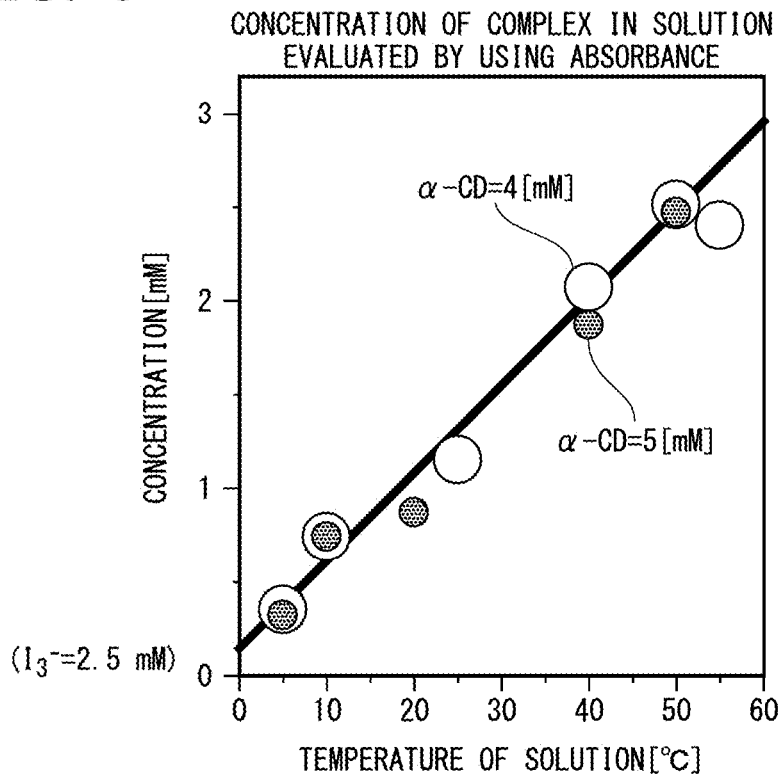
FIG. 6 is a graph showing the concentration of a complex in a solution evaluated from an absorbance at 353 nm of a complex.

FIG. 6 is a diagram showing the complex concentration in the solution evaluated at 353 nm absorbance of a complex of α-cyclodextrin and $I_3^-$. At the low temperature side, the complex of α-cyclodextrin and $I_3^-$ self-assemble and the concentration thereof in the solution decreases.

From FIG. 6, Table 2 shows data of concentrations of $I_3^-$ in the case of having precipitation and no precipitation when the first electrode is 10° C. and the second electrode is 40° C.

TABLE 2

| | Concentrations of $I_3^-$ [mM] | | |
|---|---|---|---|
| | 10° C. | 40° C. | Ratio of Concentrations |
| Precipitation | 9.9 × 10$^{-4}$ | 2.6 × 10$^{-2}$ | 26 times |
| No Precipitation | 4.2 × 10$^{-3}$ | 3.2 × 10$^{-2}$ | 7.6 times |

Therefore, the reason of increasing Seebeck coefficient by adding potassium ion is that the concentration difference of $I_3^-$ increases by formation of precipitate.

<<Thermo-Electrochemical Cells of Third and Fourth Embodiments>>

[Comparison of Effects among α-CD, β-CD, and γ-CD]

The thermo-electrochemical cells of the third and the fourth embodiments of the present invention are the same as the thermo-electrochemical cell of the first embodiment, except that β-cyclodextrin (β-CD) and γ-cyclodextrin (γ-CD) were used instead of α-cyclodextrin (α-CD), respectively.

Figure 7:
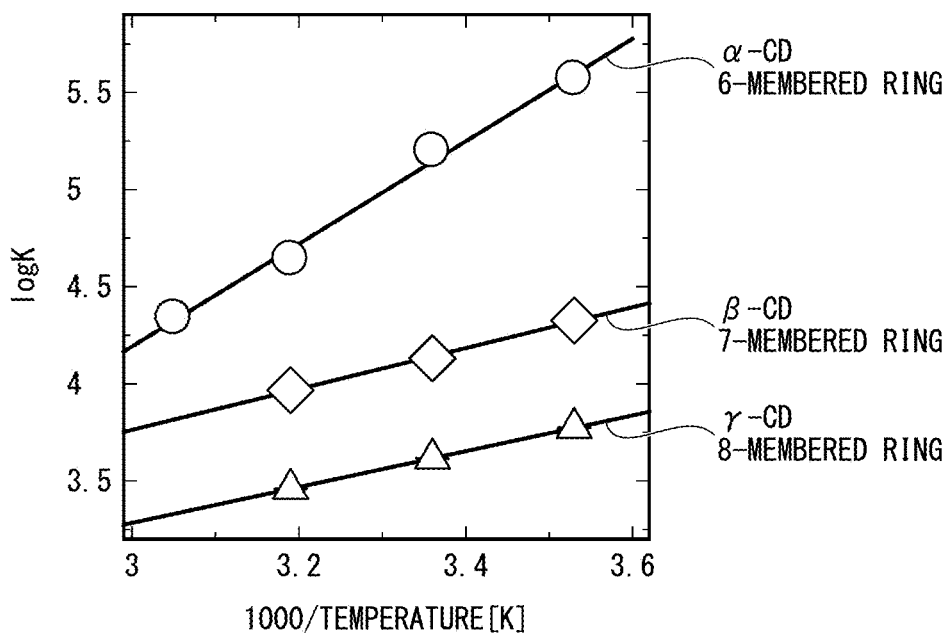
FIG. 7 are Arrhenius plots of binding constants for forming inclusion compounds between $I_3^-$ ion and α-cyclodextrin (α-CD), $I_3^-$ ion and β-cyclodextrin (β-CD), or $I_3^-$ ion and γ-cyclodextrin (γ-CD).

FIG. 7 are an Arrhenius plots of binding constants for forming inclusion compounds of $I_3^-$ ion and α-cyclodextrin (α-CD), $I_3^-$ ion and β-cyclodextrin (β-CD), and $I_3^-$ ion and γ-cyclodextrin (γ-CD). The β-Cyclodextrin and the γ-cyclodextrin do not have as large binding constants as α-cyclodextrin, but have a certain temperature dependence.

The thermo-electrochemical cells having β-cyclodextrin and γ-cyclodextrin cannot obtain Seebeck coefficients (Se) as high as α-cyclodextrin. However, they show higher Seebeck coefficients (Se) than that without addition of cyclodextrin.

FIG. 7 are an Arrhenius plots of binding constants for forming inclusion compounds of $I_3^-$ ion and α-cyclodextrin (α-CD), $I_3^-$ ion and β-cyclodextrin (β-CD), and $I^{3-}$ ion and γ-cyclodextrin (γ-CD).

As shown in FIG. 7, similarly to α-cyclodextrin (α-CD), when β-cyclodextrin (β-CD) is added, β-CD–$I_3^-$ inclusion compound is formed, when 4 mM β-cyclodextrin was added, Se is 1.1 mV/K. Furthermore, when $K^+$ is added, precipitation occurs and Se is 1.5 mV/K. When γ-cyclodextrin is added, γ-CD-$I_3^-$ inclusion compound is formed. Se is 0.92 mV/K. However, precipitation does not occur even if $K^+$ is further added. Se is 1.0 mV/K.

<<Thermo-Electrochemical Cell of Fifth Embodiment of Present Invention>>

[Starch Used as Capture Compound]

The thermo-electrochemical cell of the fifth embodiment of the present invention is the same as that of the thermo-electrochemical cell of the first embodiment, except that amylose (a main component of starch) is used as a capture compound, instead of cyclodextrin. Similarly, the Seebeck coefficient is improved.

Figure 8:
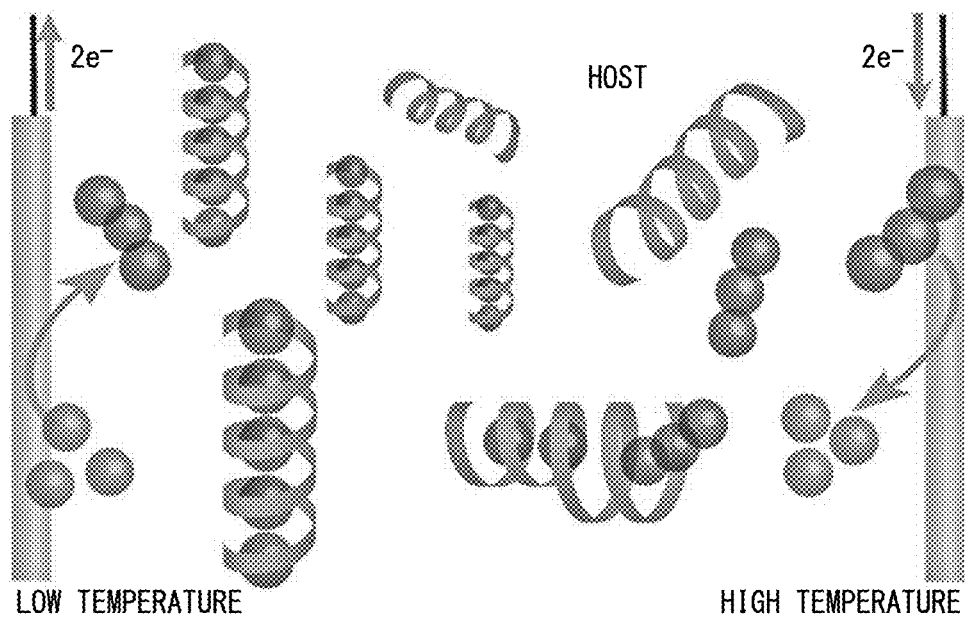
FIG. 8 is a conceptual diagram showing that amylose which is a main component of starch incorporates iodine.

Amylose, the main component of starch, incorporates (captures) iodine as shown in FIG. 8.

The effect of improving the Seebeck coefficient can also be observed when amylose (starch) is used as the capture compound.

Figure 9:
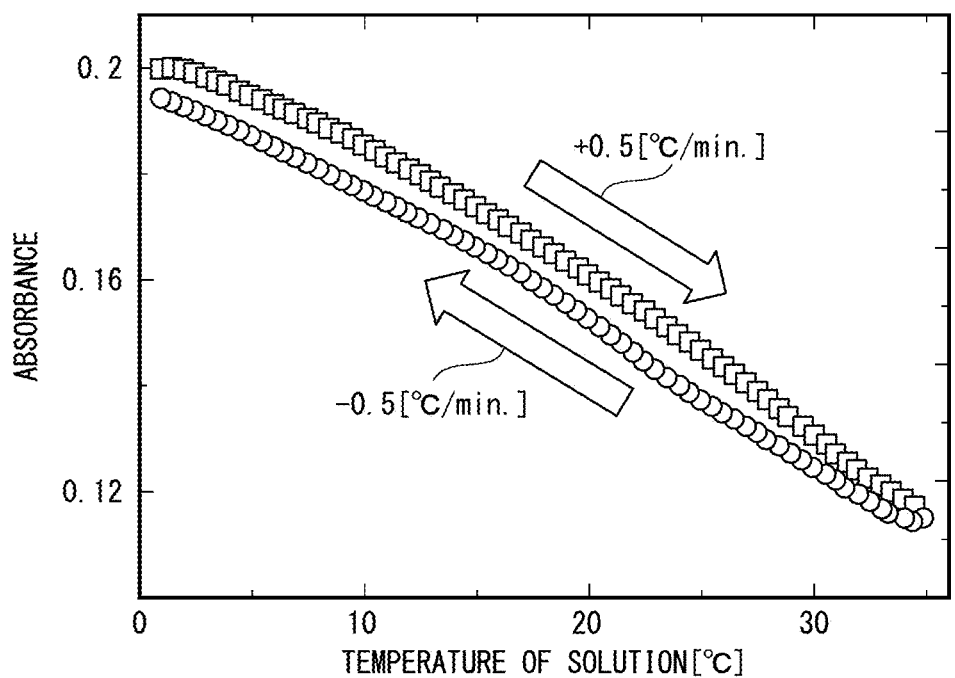
FIG. 9 is a diagram showing a change in absorbance (observation wavelength: 552 nm) by an iodine-starch complex.

FIG. 9 is a diagram showing a change in absorbance (observation wavelength: 552 nm) of an iodine-starch complex. As the temperature rises, the concentration decreases and as the temperature decreases, the concentration increases.

In the thermo-electrochemical cell of the fifth embodiment of the present invention, as in the first embodiment, the Seebeck coefficient is improved by addition of starch.

<Thermoelectric Sensor>

The thermoelectric sensor of the present invention is an apparatus that senses a temperature difference between electrodes using each of the above-described thermoelectric conversion materials of the present invention. Since the thermoelectric conversion materials of the present invention have high Seebeck coefficients, the thermoelectric sensor has a high sensitivity when it is used as a temperature sensor. An example of the thermoelectric sensor is a thermoelectric sensor made of a thermoelectric conversion device which includes a thermoelectric conversion material including the above-mentioned α-cyclodextrin, an iodide ion, a triiodide ion, and an aqueous solution containing potassium ions; and a first and second platinum electrodes. In such a thermoelectric sensor, it is possible to generate a voltage of 2 mV even if the temperature difference between the first and second electrodes is only 1° C. By connecting the thermoelectric sensor to a device which is capable of measuring a potential difference with a highly accurate, such as voltmeter or the like, it is possible to create a sensor that can recognize a temperature difference of about 0.000001° C. If this temperature difference is capable of being recognized, for example, a heat transmitted from a body temperature of a person behind a wall heats one of electrodes, and as a result, the sensor can sense the person. In addition, a weak infrared radiation radiated from a heat source can be sensed. Furthermore, when a material which is capable of generating heat by absorbing a specific light such as ultraviolet ray is provided at one electrode side, it can be applied to a thermoelectric sensor for sensing a slight light.

EXAMPLES

Example 1

<Preparation of Electrolyte Solution>

Figure 10:
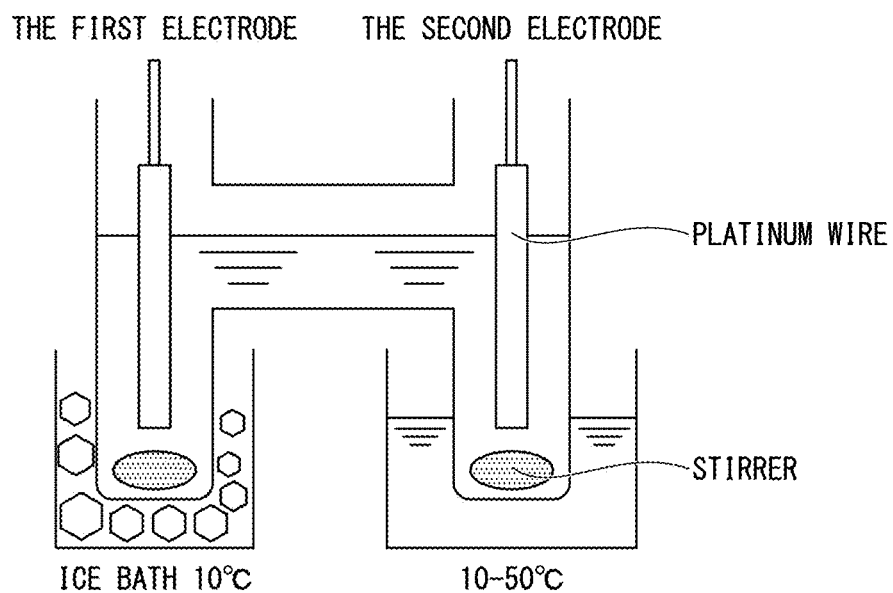
FIG. 10 is a conceptual diagram showing a thereto-electrochemical cell of Example 1 prepared using an H-type container.

$I_2$ (317 mg, 1.25 mmol), KI (415 mg, 2.50 mmol) and water were added to an H-type container having two tubes as shown in FIG. 10, and a solution having [KI] 50 mM and [$KI_3$] 50 mM were prepared. To 2.5 ml of the solution, 0.2 mmol of α-CD (25 mM) was added, followed by dilution with a KI aqueous solution to obtain [$KI_3$] 2.5 mM, [KI] 10 mM, and [α-CD] 4 mM. The first test tube of the two H type test tubes was set in an ice bath and the temperature in the vicinity of the first electrode was held at 10° C. The second test tube was set in a thermostat capable of adjusting at 10 to 50° C., and the temperature in the vicinity of the second electrode was adjusted to 10 to 50° C.

<Configuration of Cell>

Platinum wires were inserted to each of the first tube and the second tube containing an aqueous solution having [$KI_3$] 2.5 mM, [KI] 10 mM, and [α-CD] 4 mM.

<Increase of Seebeck Coefficient by Inclusion of $I_3^-$>

Figure 11:
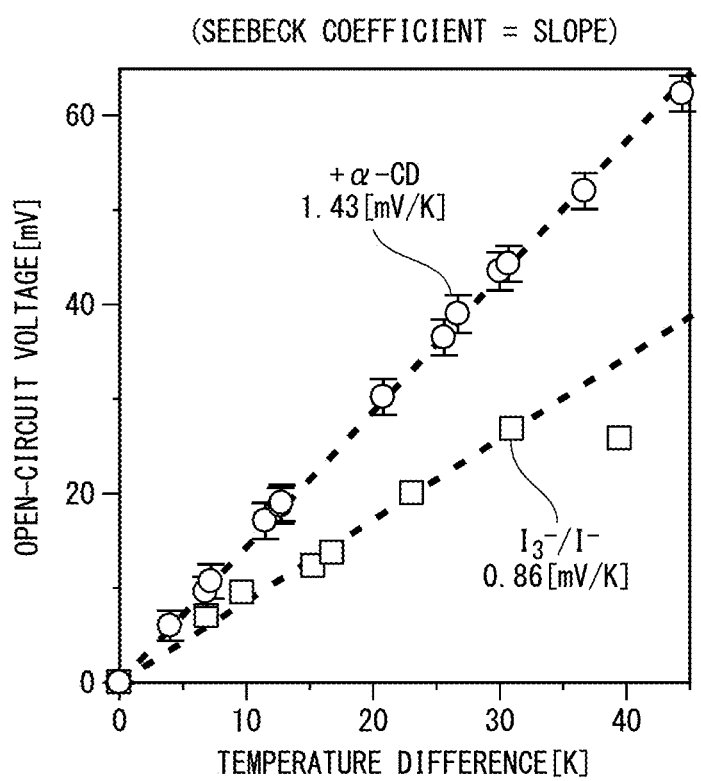
FIG. 11 is a plot of evaluation of Seebeck coefficient of Example 1.

A Seebeck coefficient was determined from a slope of a straight line shown in FIG. 11. The Seebeck coefficients were increased from 0.86 mV/K to 1.43 mV/K by adding α-cyclodextrin.

Example 2

Figure 12:
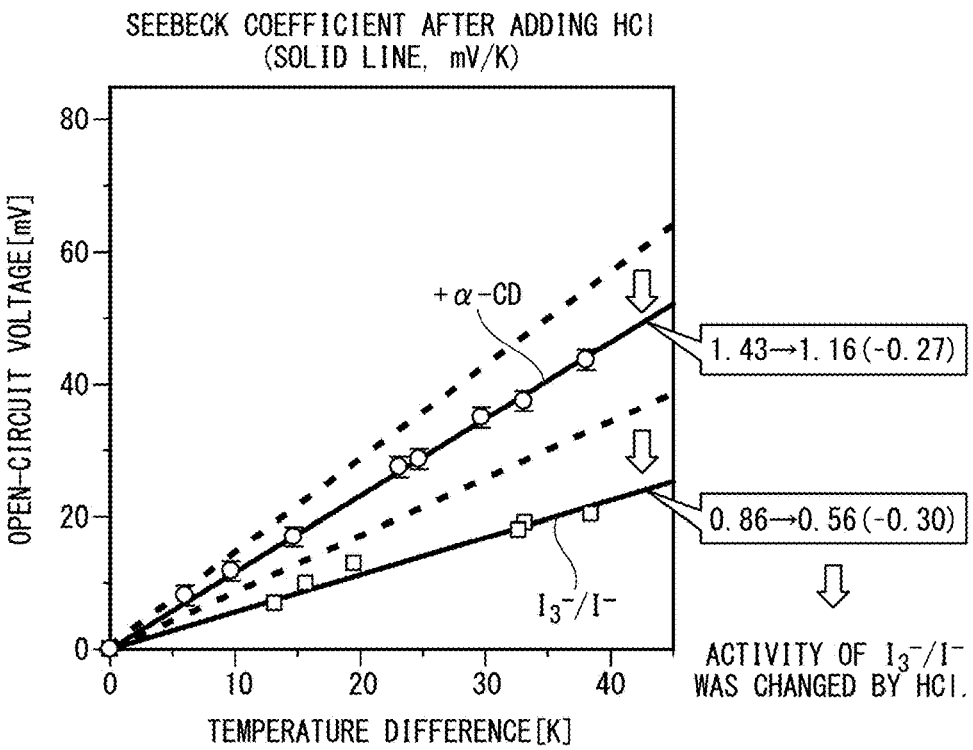
FIG. 12 is a diagram showing the Seebeck coefficient (solid line, mV/K) after addition of HCl.

Example 2 is the same as that of Example 1, except for addition of HCl (0.1 M). FIG. 12 is a diagram showing a Seebeck coefficient (solid line) [mV/K] after addition of HCl. As the same as that in Example 1, from FIG. 12, the Seebeck Coefficient (Se) is increased from 0.56 mV/K without addition of α-CD to 1.16 mV/K after the addition of the same. FIG. 12 also shows comparison with Example 1. The activity of $I_3^-/I^-$ was changed by adding HCl. Se was decreased from 1.43 mV/K to 1.16 mV/K with addition of α-CD, and it decreased from 0.86 mV/K to 0.56 mV/K without addition of α-CD.

<Increase of Power Density Due to Inclusion (Electrolyte: HCl)>

Increase of both an open-circuit voltage (Voc) and an output power density by adding α-CD was observed.

Figure 13:
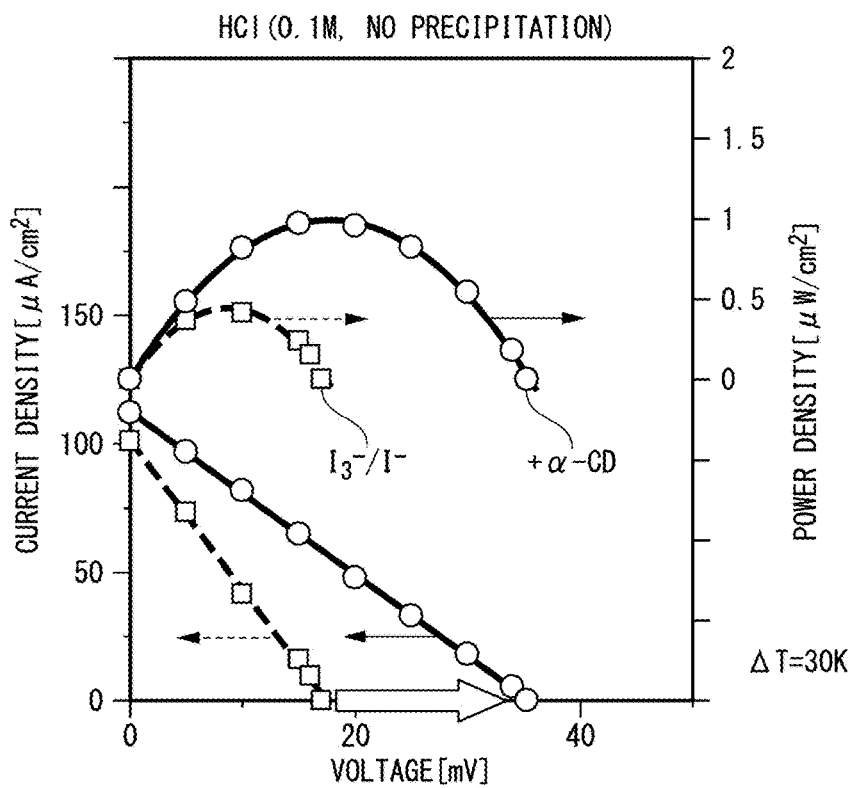
FIG. 13 is a graph showing an increase in power density (electrolyte: HCl) due to $I_3^-$ inclusion.

FIG. 13 is a diagram showing increase of power density (electrolyte: HCl) due to $I_3^-$ inclusion.

<Variation of Power Density with Time (with α-CD)>

Figure 14:
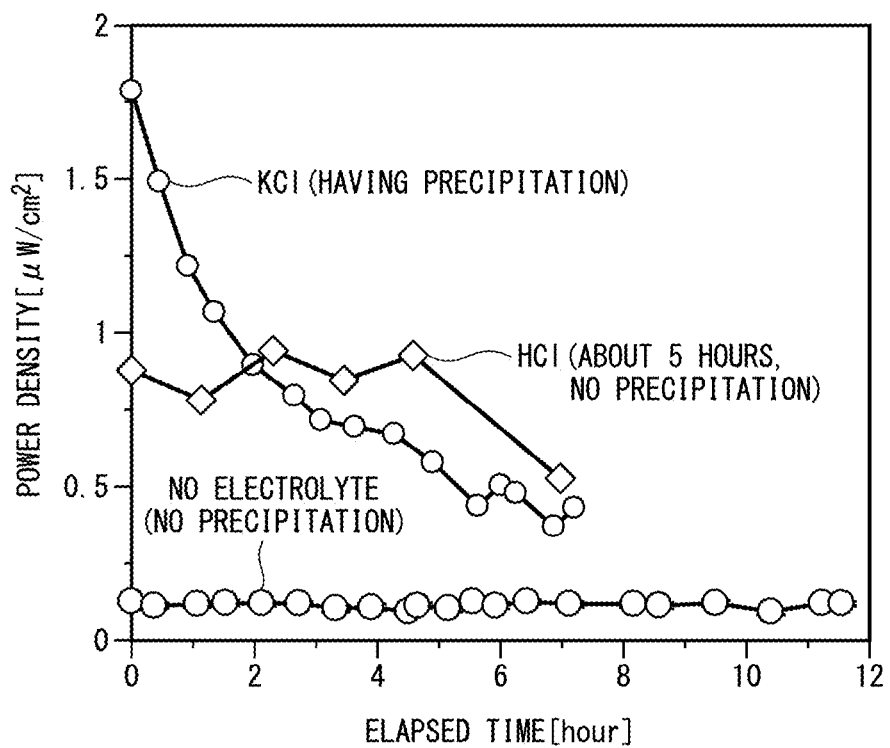
FIG. 14 is a diagram showing temporal changes in the power densities of cells to which α-CD and an electrolyte are added.

FIG. 14 is a diagram in which the temporal change in the power density of a cell to which α-CD and an electrolyte (< >: HCl) were added was recorded.

Example 3

Figure 15:
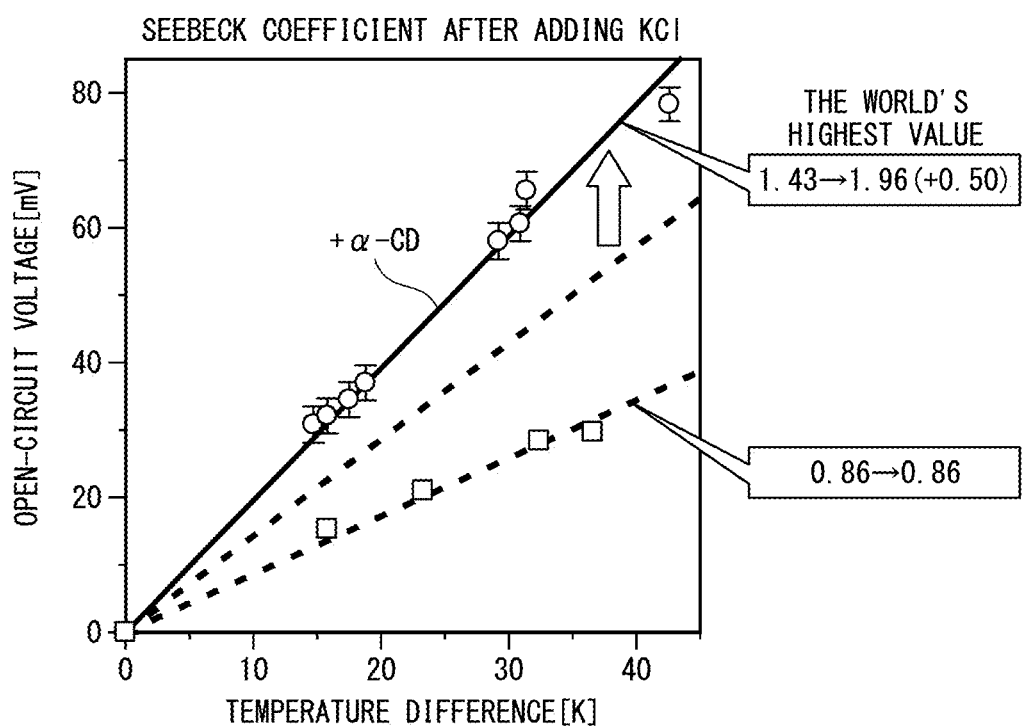
FIG. 15 is a diagram showing Seebeck coefficient (solid line, mV/K) after addition of KCl.

Example 3 is the same as that of Example 1, except for the addition of KCl (0.2 M). FIG. 15 shows the Seebeck coefficient (solid line, mV/K) after addition of KCl. As in Example 1, in FIG. 15, the Seebeck coefficient (Se) increased from 0.86 mV/K without α-CD to 1.96 mV/K after addition of α-CD. FIG. 15 also shows a comparison with Example 1. Addition of KCl did not change the activity of $I_3^-/I^-$. When α-CD was added, Se increased from 1.43 mV/K to 1.96 mV/K, and when α-CD was not added, Se was 0.86 mV/K without change.

In Example 3, unlike Examples 1 and 2, a dark green precipitate K[(α-CD)$_2$–$I_5$] was observed. It is considered that Seebeck coefficient increases because of the formation of precipitates.

<Crystal Structure of K[(α-CD)$_2$–I$_5$]>

In order to identify the dark green precipitate, a following aqueous solution was prepared and a structure of the precipitate was evaluated. The concentrations of each ion in the aqueous solution is shown below.

[I$_3$$^-$]$_0$=[I$^-$]$_0$=8 mM,
[α-CD]$_0$=4 mM
[KCl]=80 mM

Figure 16:
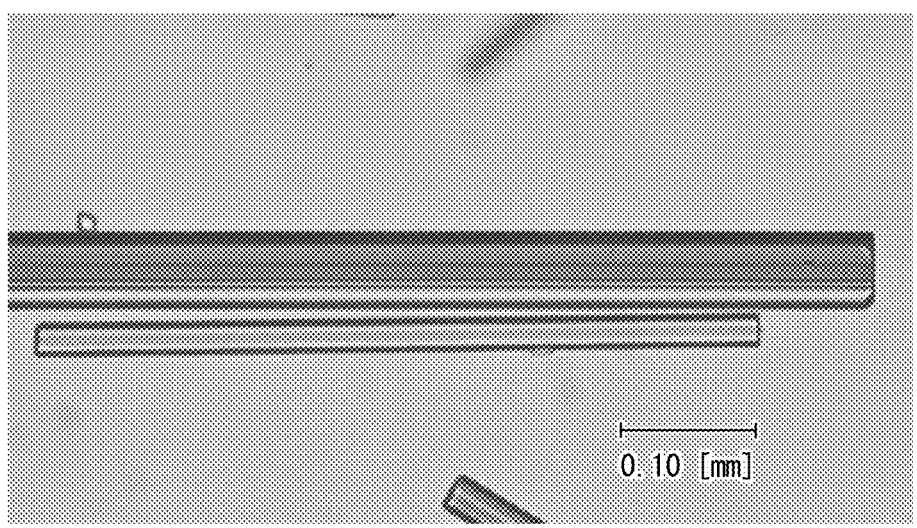
FIG. 16 is a photomicrograph of acicular crystals.
Figure 17:
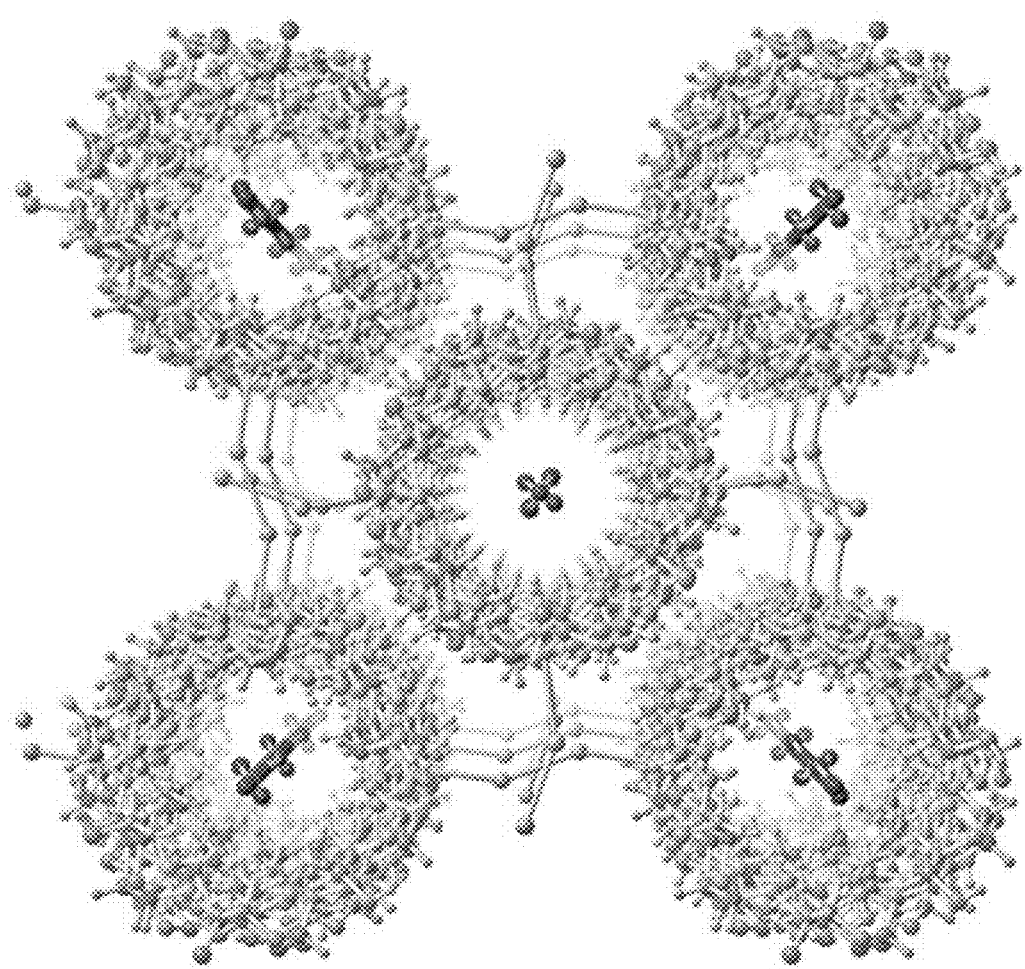
FIG. 17 is a view showing a crystal structure of $K[(\alpha\text{-CD})_2\text{–}I_5]$.

An acicular crystals was obtained by allowing the above solution to stand for 2 days (FIG. 16). The crystal structure thereof was measured by an X-ray diffraction apparatus (XRD), and the analysis result thereof is shown in FIG. 17.

[Increase in Power Density by Inclusion (Electrolyte: KCl)]

Figure 18:
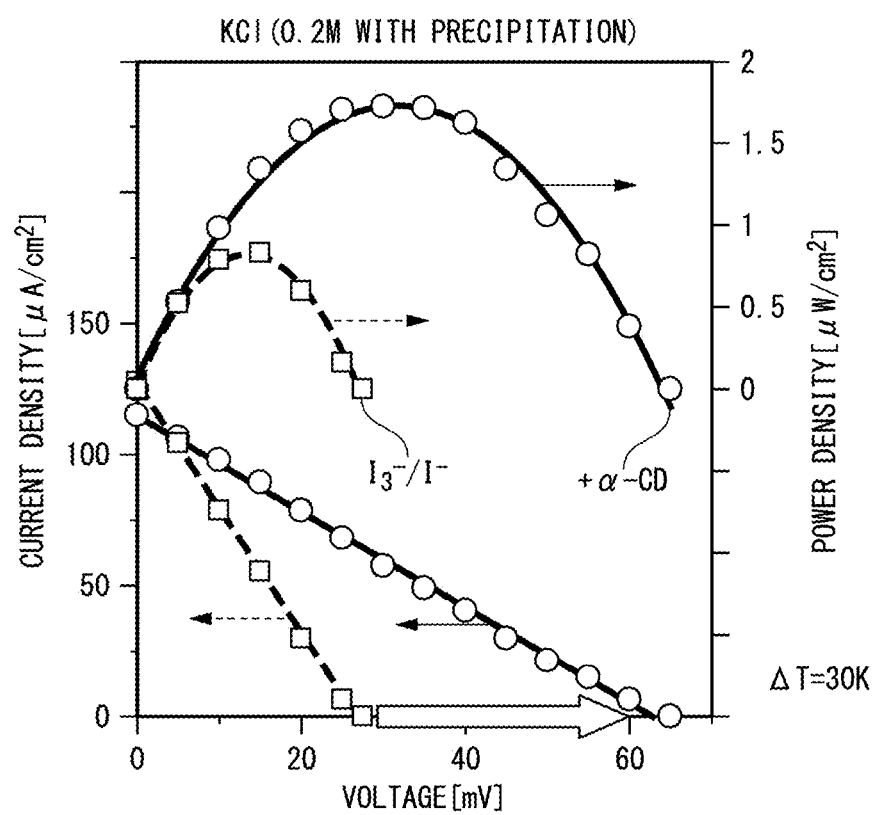
FIG. 18 is a graph showing an increase in power densities (electrolyte: KCl) by inclusion of $I_3^-$.

As shown in FIG. 18, an increase in open circuit voltage (Voc) and an increase in output power density were observed by addition of α-CD.

[Temporal Change in Power Density (with α-CD)]

FIG. 14 is a diagram in which the temporal change in the power density of a cell to which α-CD and an electrolyte (○: KCl) were added was recorded.

Example 4

<Addition Effects of α-CD, β-CD, γ-CD, Di-O-Me-α-CD, Tri-O-Me-α-CD>

Thermo-electrochemical cells of Example 4 were the same as that of the thermo-electrochemical cell of Example 1, except that α-cyclodextrin (α-CD) was replaced with β-cyclodextrin (β-CD), γ-cyclodextrin (γ-CD), hexakis-(2,6-di-O-methyl)-α-(α-cyclodextrin) (Di-O-Me-α-CD), and hexakis-(2,3,6-tri-O-methyl)-α-cyclodextrin (Tri-O-Me-α-CD), respectively.

Figure 19A:
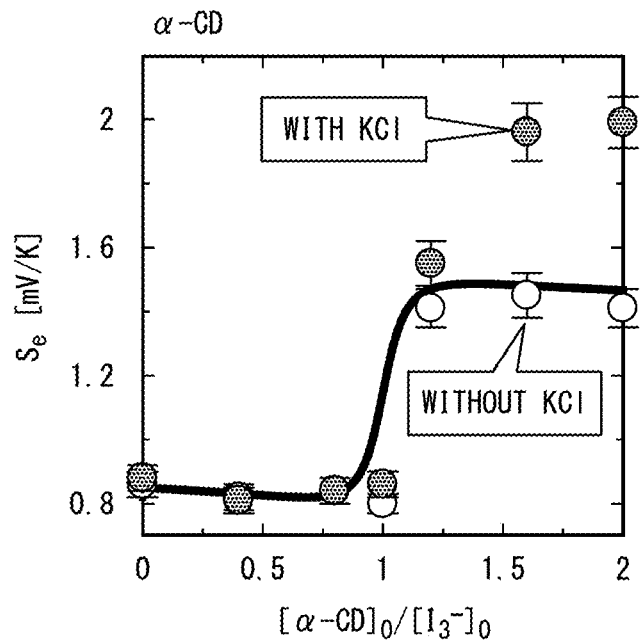
FIG. 19A is a diagram showing the relationship between Seebeck coefficient (Se) and a ratio of α-CD concentration to $I_3^-$ concentration. Concentration conditions: [CD]=0 to 5 mM; $[I_3^-]$=2.5 mM; $[I^-]$=10 mM; and [KCl]=0, 200 mM.
Figure 19B:
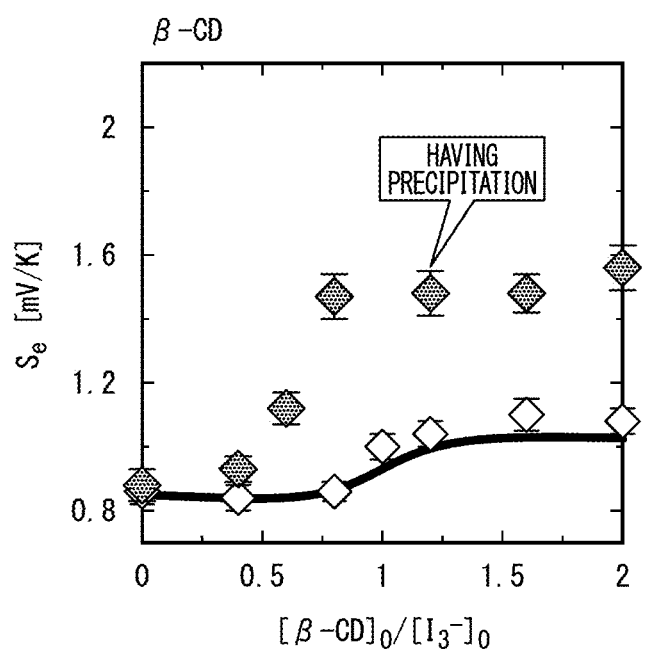
FIG. 19B is a diagram showing the relationship between Seebeck coefficient (Se) and a ratio of β-CD concentration to $I_3^-$ concentration. Concentration conditions: [CD]=0 to 5 mM; $[I_3^-]$=2.5 mM; $[I^-]$=10 mM; and [KCl]=0,200 mM.
Figure 19C:
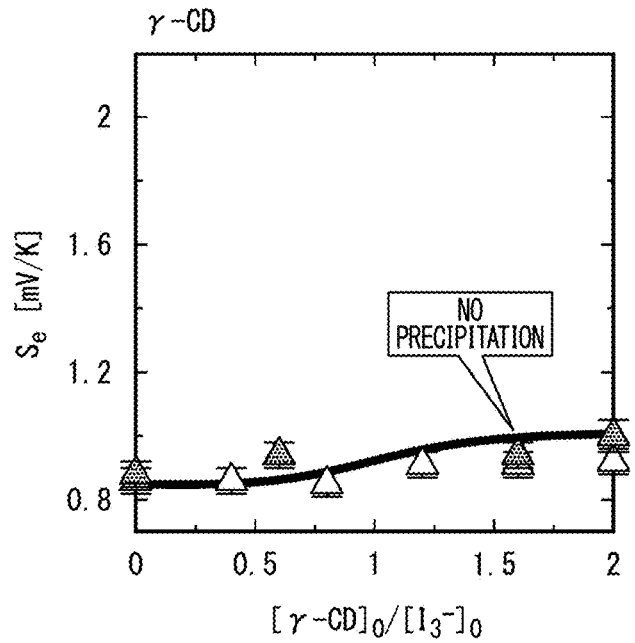
FIG. 19C is a diagram showing the relationship between the Seebeck coefficient (Se) and the ratio of γ-CD concentration to $I_3^-$ concentration. Concentration conditions: [CD]=0 to 5 mM; $[I_3^-]$=2.5 mM; $[I^-]$=10 mM; and [KCl]=0,200 mM.

FIGS. 19A, 19B, and 19C are diagrams showing the relationships between the Seebeck coefficient and the relative concentrations of the host molecules, in which an added concentration of cyclodextrin ([CD]$_0$) was 0 to 5 mM, an added concentration of triiodide ion ([I$_3$$^-$]$_0$) was 2.5 mM, a concentration of iodide ion ([I$^-$]) was 10 mM, and a concentration of potassium chloride ([KCl]) was 0, 200 mM.

As shown in FIGS. 19A, 19 B, and 19C, similarly to α-cyclodextrin, when β-cyclodextrin was added, a β-CD–I$_3$$^-$ inclusion compound was formed. For example, when 4 mM β-cyclodextrin was added, Se was 1.1 mV/K. Furthermore, when K$^+$ was added, precipitation occurred, and Se was 1.5 mV/K. When γ-cyclodextrin was added, γ-CD–I$_3$$^-$ inclusion compound was formed. For example, when 4 mM of β-cyclodextrin was added, Se was 1.1 mV/K. When K$^+$ was further added, precipitation did not occur.

Figure 19D:
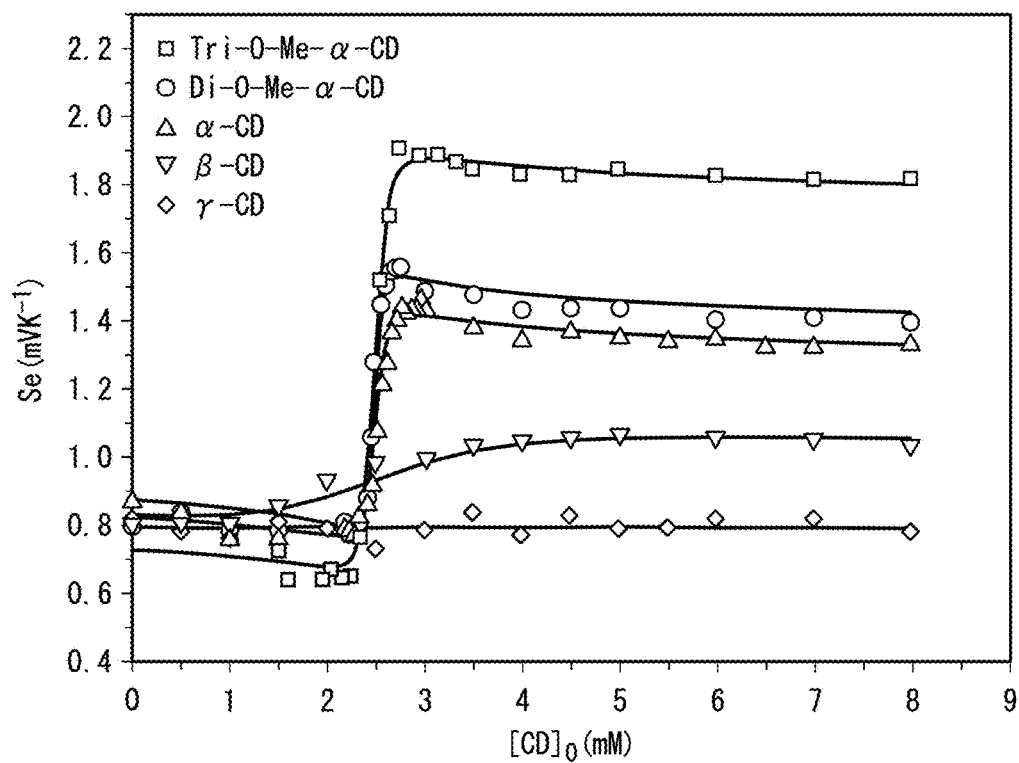
FIG. 19D is a diagram showing the relationship between Seebeck coefficients (Se) and concentrations of five host molecules. Concentration conditions: [CD]=0 to 8 mM; $[I_3^-]$=2.5 mM; and $[I^-]$=10 mM.

FIG. 19D is a graph showing the relationship between Seebeck coefficients and the concentrations of five kinds of host molecules, which is a graph showing the relationship between the added concentration of cyclodextrin ([CD]$_0$) 0 to 8 mM, the added concentration of triiodide ion ([I$_3$$^-$]0) was 2.5 mM, and the concentration of iodide ion ([I$^-$]) was 10 mM.

As shown in FIG. 19D, similarly to the α-cyclodextrin, when β-cyclodextrin was added, β-CD–I$_3$$^-$ inclusion compound was formed. For example, when 4 mM of β-cyclodextrin was added, Se was 1.1 mV/K. When γ-cyclodextrin was added, γ-CD–I$_3$$^-$ inclusion compound was formed. For example, when 4 mM γ-cyclodextrin was added, Se was 0.8 mV/K. When hexakis-(2,6-di-O-methyl)-α-cyclodextrin was added, Di-O-Me-α-CD–I$_3$$^-$ inclusion compound was formed. For example, when 4 mM hexakis-(2,6-di-O-methyl)-α-cyclodextrin was added, Se was 1.5 mV/K. When hexakis-(2,3,6-tri-O-methyl)-α-cyclodextrin was added, Tri-O-Me-α-CD–I$_3$$^-$ inclusion compound was formed. For example, when 4 mM hexakis-(2,3,6-tri-O-methyl)-α-cyclodextrin was added, Se was 1.85 mV/K.

<Comparison of Current Density-Voltage Curve and Power Density-Voltage Curve Among α-CD, β-CD, and γ-CD>

Figure 20:
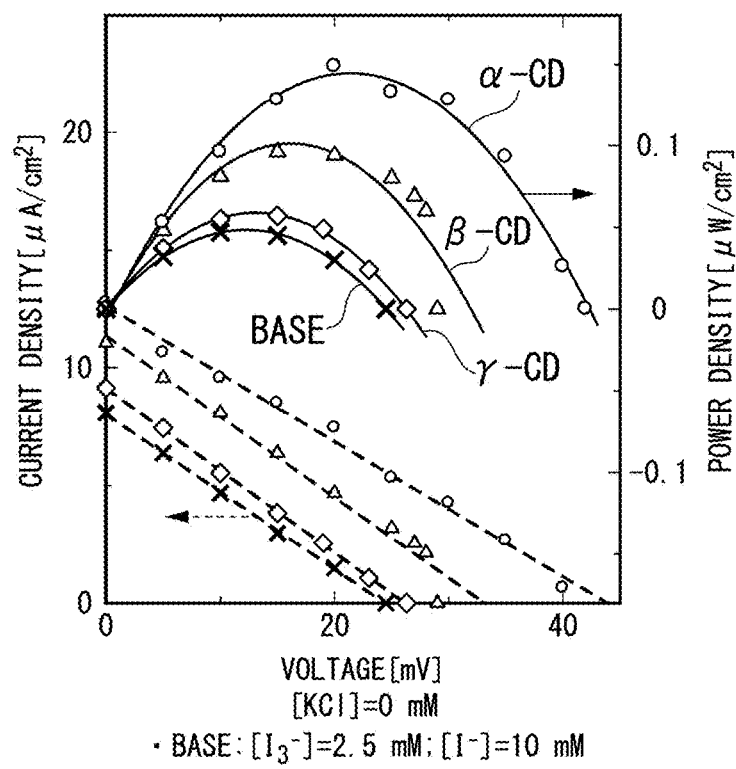
FIG. 20 shows a curve of a current density vs a voltage and a curve of power density vs a voltage without addition of KCl.
Figure 21:
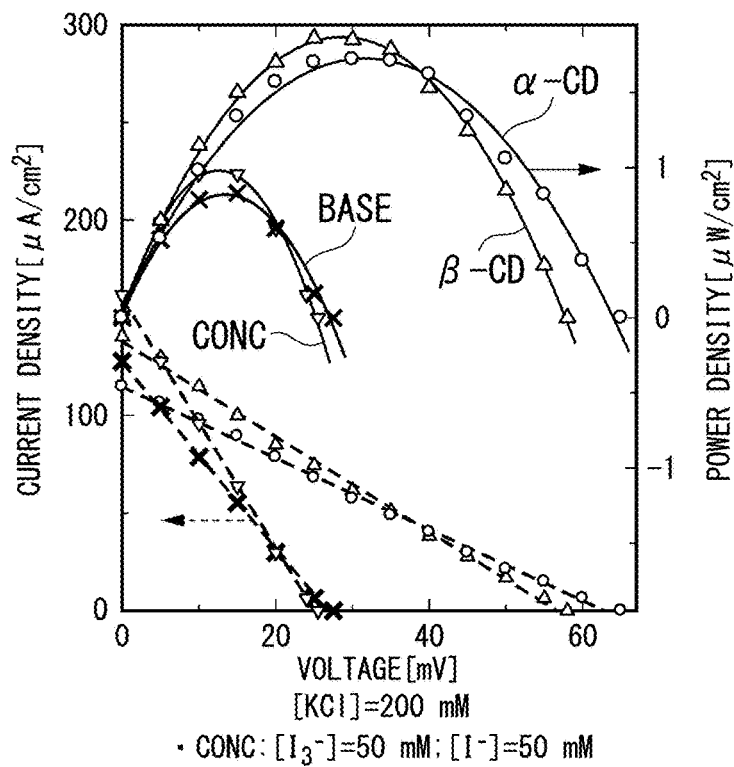
FIG. 21 shows a curve of a current density vs a voltage and a curve of power density vs a voltage with addition of 200 mM KCl.

FIG. 20 is a diagram of a curve of a current density vs a voltage and a curve of power density vs a voltage without addition of KCl. The concentration of each ion in the solution are shown as follows.

x: [CD]=0 mM
[I$_3$$^-$]=2.5 mM
[I$^-$]=10 mM
◇: γ-CD addition
△: β-CD addition
○: α-CD addition
Solid Line: Power Density-Voltage Curve
Broken Line: Current Density-Voltage Curve FIG. 21 is a diagram of a curve of a current density vs a voltage and a curve of power density vs a voltage with addition of 200 mM KCl. The concentration of each ion in the solution is shown as follows.

x: [CD]=0 mM
[I$_3$$^-$]=2.5 mM
[I$^-$]=10 mM
[KCl]=200 mM
∇: [CD]=0 mM
[I$_3$$^-$]=50 mM
[I$^-$]=50 mM
△: Addition of β-CD into the case of above "x"
○: Addition of α-CD into the case of above "x"
Solid Line: Power Density-Voltage Curve
Broken Line: Current Density-Voltage Curve From the above results, even when β-CD and γ-CD which have larger pores than α-CD were used as host molecules, a change of Seebeck coefficients reflecting the respective binding constant with I$_3$$^-$ were observed.

Example 5

Figure 22:
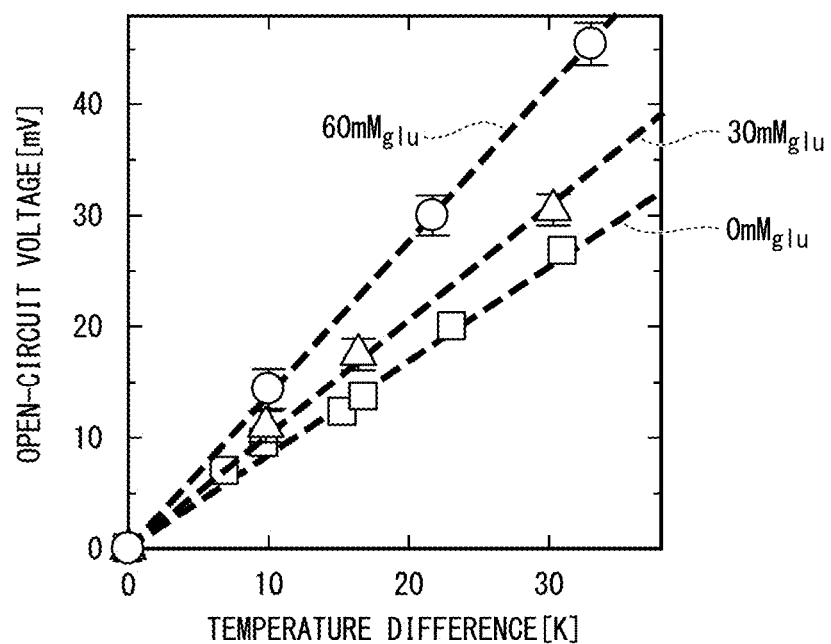
FIG. 22 is a diagram for evaluating Seebeck coefficient.

Example 5 was the same as in Example 1, except that instead of cyclodextrin, starch was added with addition concentration 0, 30, and 60 mM (glu equivalent) in terms of glucose. Seebeck coefficient was evaluated, and the relationship between the open-circuit voltage (Voc) and the temperature difference between the electrodes were evaluated, after adding starch at a concentration 0, 30, or 60 mM (glu equivalent) in terms of glucose, and Seebeck Coefficient shown in FIG. 22 was determined.

Figure 23:
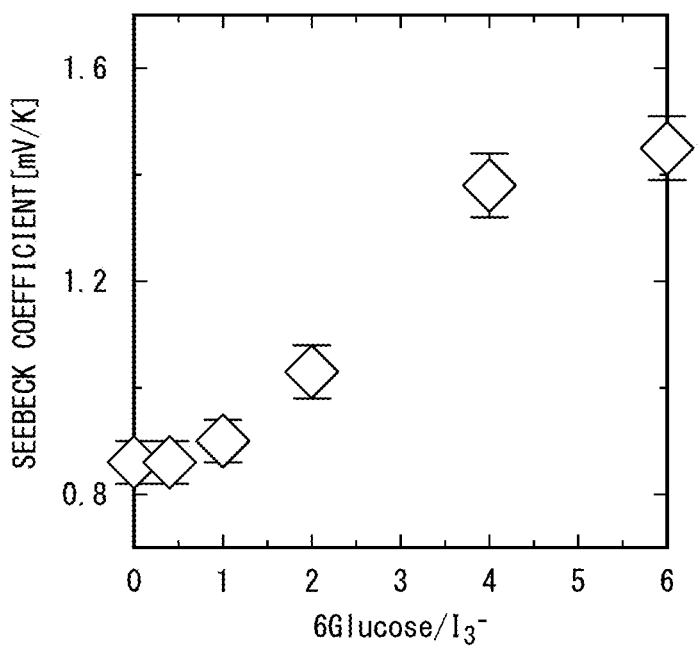
FIG. 23 is a graph showing the relationship between Seebeck coefficient and a ratio of starch concentration (in terms of 6 glucose) and $I_3^-$ concentration.

FIG. 23 is a graph showing the relationship between the Seebeck coefficient and the ratio ([6gluose]/[I$_3$$^-$]) of the starch concentration (6 glucose equivalent concentration, 6 gluose) and concentration.

<Temporal Change in Power Density (Starch)>

Figure 24:
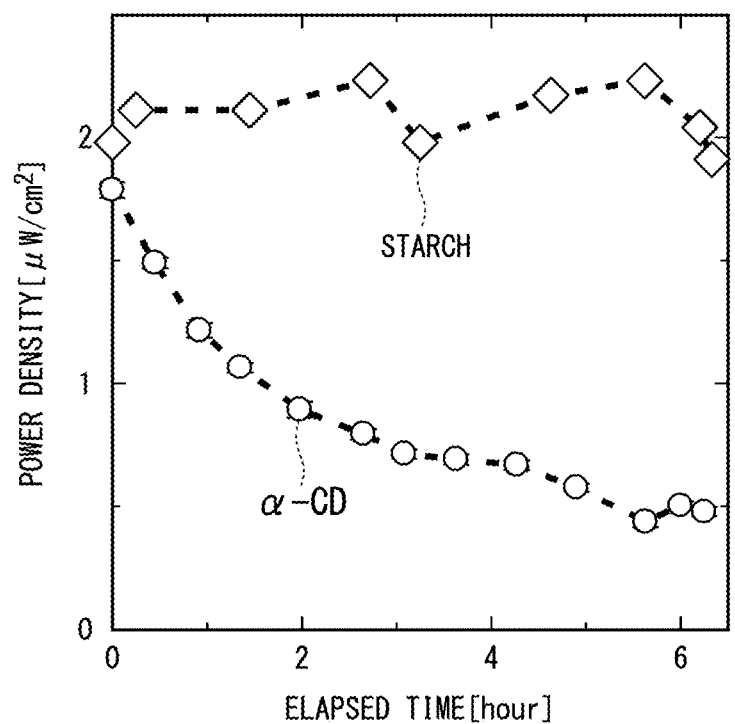
FIG. 24 is a graph showing a temporal change in an electric power with addition of 0.2 M of KCl in Example 5 in which starch was added.

FIG. 24 is a graph showing a temporal change in power density when 0.2 M of KCl was added in this example in which starch was added. For comparison, FIG. 24 also includes a graph showing a temporal change in power density when 0.2 M of KCl was added in Example 3 in which α-cyclodextrin was added.

Example 6

Figure 25:
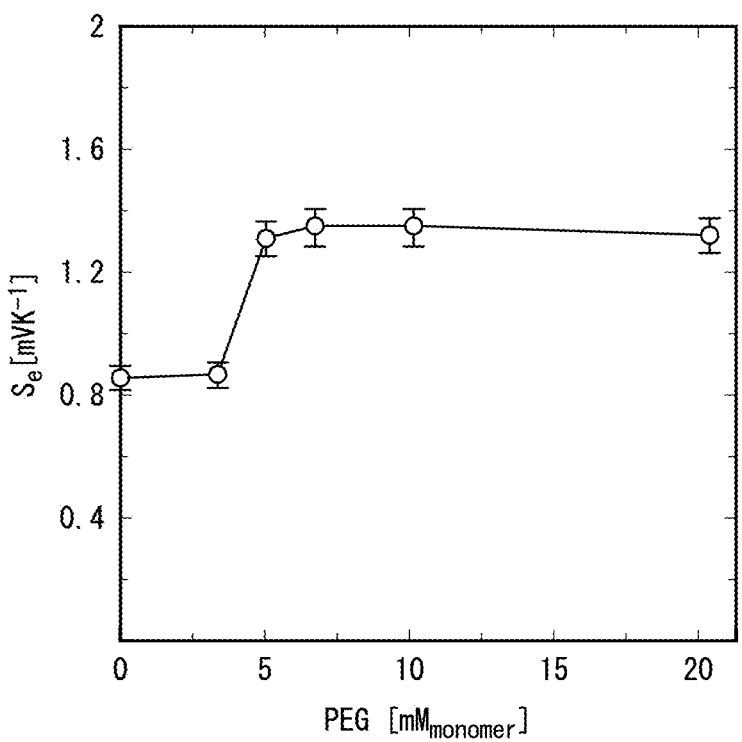
FIG. 25 is a diagram showing a relationship between Seebeck coefficient (Se) and a concentration (in terms of monomer, $mM_{monomer}$) of polyethylene glycol 3000 (PEG 3000).

In Example 6, a Seebeck coefficient was evaluated similarly as in Example 1, except that polyethylene glycol 4000(Kishida Chemical Co., Ltd., average molecular weight is 2,700 to 3,400) (PEG 4000) was added instead of cyclodextrin. FIG. 25 is a diagram showing a relationship between the Seebeck coefficient and polyethylene glycol 3000 concentration (in terms of monomer, $mM_{monomer}$) As shown in FIG. 25, when the added concentration was 10 mM in terms of monomer, the Seebeck coefficient was 1.35 mV/IK.

Example 7

Figure 26:
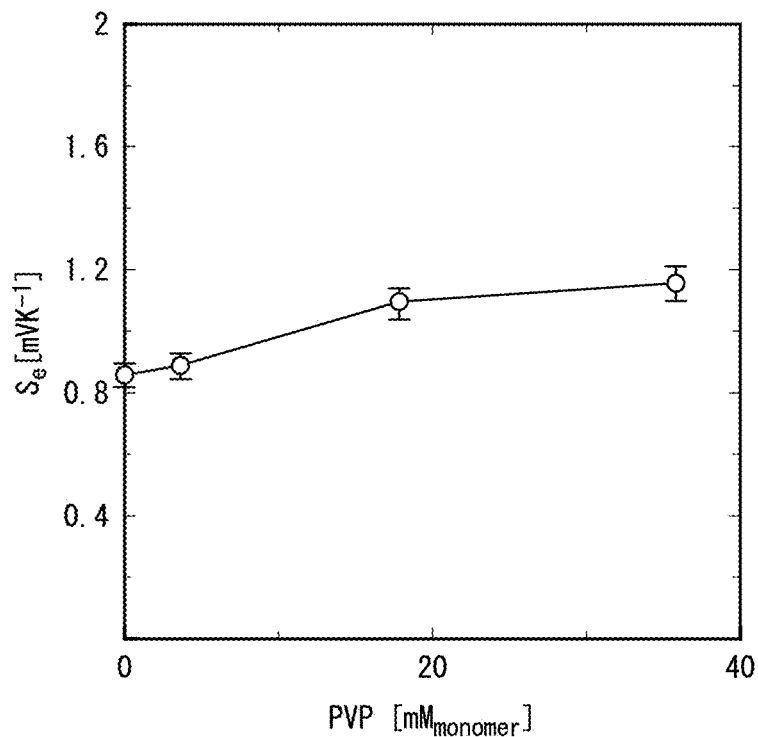
FIG. 26 is a diagram showing a relationship between Seebeck coefficient (Se) and concentration (in terms of monomer, $mM_{monomer}$) of polyvinyl pyrrolidone (PVP).

In Example 7, a Seebeck coefficient was evaluated similarly as in Example 1, except that polyvinyl pyrrolidone (Kishida Chemical Co., Ltd., molecular weight 40,000) (PVP) was added instead of cyclodextrin. FIG. 26 is a graph showing the relationship between Seebeck coefficient and polyvinyl pyrrolidone concentration (monomer-equivalent concentration, $mM_{monomer}$). When the addition concentration was 20 mM in terms of monomer, the Seebeck coefficient was 1.15 mV/K.

Example 8

Figure 27:
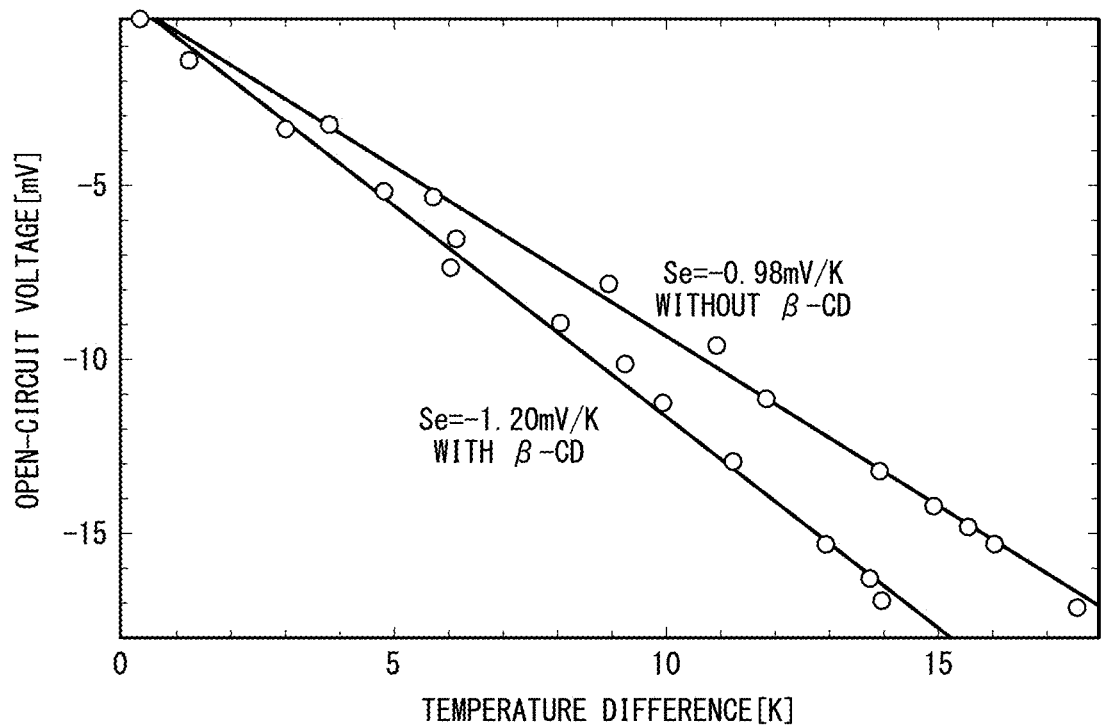
FIG. 27 is a diagram for evaluating Seebeck coefficients.

In Example 8, a Seebeck coefficient was evaluated similarly as in Example 1, except that as a redox pair ferrocene monocarboxylic acid (Fe(II)) (manufactured by Sigma-Aldrich) and its oxidation product ferrocenium monocarboxylic acid (Fe(III)) was used instead of iodide ion and triiodide ion, and β-cyclodextrin was added instead of α-cyclodextrin. As shown in FIG. 27, a relationship between open circuit voltage (Voc) without β-cyclodextrin and with 2.0 mM β-cyclodextrin; and temperature difference (ΔT) between electrodes was evaluated, and each Seebeck coefficient was −0.98 mV/K and −1.20 mV/K, respectively. It was confirmed that β-cyclodextrin selectively captured the reduced ferrocene monocarboxylic acid (Fe(II)).

The invention claimed is:

1. A material comprising:
a redox pair
a capture compound which captures only one of the redox pair selectively at low temperature and releases the only one of the redox pair at high temperature, and
water, or an aqueous solvent comprising water and an organic solvent,
wherein the redox pair undergoes redox reaction in the water, or the aqueous solvent, and
the capture compound, selectively captures the only one of the redox pair in the water, or the aqueous solvent at the low temperature, and releases the only one of the redox at the high temperature in the water, or the aqueous solvent, and
wherein the material is a thermoelectric conversion material, and
the capture compound is dissolved in the water, or the aqueous solvent.

2. The material according to claim 1, wherein the capture compound is at least one selected from the group consisting of a cyclic compound and a spiral compound.

3. The material according to claim 1, wherein the capture compound is a self-assembly molecule at the low temperature.

4. The material according to claim 1, wherein the capture compound is a host compound forming an inclusion compound.

5. The material according to claim 1, wherein the capture compound is one or more selected from the group consisting of cyclodextrin, starch, polyvinyl pyrrolidone, and polyethylene oxide.

6. The material according to claim 1, wherein the redox pair is a pair selected from the group consisting of iodide ion and triiodide ion, ferrocyanide ion and ferricyanide ion, and tris(bipyridine) cobalt (II) and tris(bipyridine) cobalt (III).

7. The material according to claim 1, wherein the thermoelectric conversion material further comprises an electrolyte for self-assembling the capture compound at the low temperature.

8. A thermoelectric conversion device comprising:
the material according to claim 1 and
a pair of electrodes.

9. The thermoelectric conversion device according to claim 8,
wherein the pair of electrodes are set to different temperatures.

10. A thermo-electrochemical cell comprising:
the thermoelectric conversion device according to claim 8.

11. A thermoelectric sensor comprising:
the thermoelectric conversion device according to claim 8.

12. A thermoelectric conversion method comprising:
forming the material according to claim 1 by adding the capture compound which captures only one of the redox pair selectively at the low temperature and releases the only one of the redox pair at the high temperature to an electrolyte,
forming a thermoelectric conversion device comprising the material according to claim 1 and a pair of electrodes by combining the pair of electrodes and the material, and
generating electricity or electric power by applying heat to the thermoelectric conversion device.

13. A method of capturing the redox pair in the thermoelectric conversion material, comprising:
capturing the only one of the redox pair at the low temperature and releasing the only one of the redox pair at the high temperature by using the capture compound contained in the material according to claim 1.

14. The material according to claim 1, wherein the thermoelectric conversion material is a material that directly converts heat to electricity or directly converts electricity to heat.

15. The material according to claim 1, wherein the material is a solution, wherein the solution comprises the redox pair, the capture compound, and the water, or the aqueous solvent.

* * * * *